(12) United States Patent
Alexandre

(10) Patent No.: US 10,103,143 B2
(45) Date of Patent: Oct. 16, 2018

(54) FIN TRANSISTOR, METHOD FOR FABRICATING THE SAME AND ELECTRONIC DEVICE INCLUDING THE SAME

(71) Applicant: SK hynix Inc., Icheon-Si (KR)

(72) Inventor: Hubert Alexandre, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/256,696

(22) Filed: Sep. 5, 2016

(65) Prior Publication Data

US 2017/0194322 A1    Jul. 6, 2017

(30) Foreign Application Priority Data

Dec. 30, 2015   (KR) ................... 10-2015-0189748

(51) Int. Cl.
| | | |
|---|---|---|
| *H01L 27/088* | (2006.01) | |
| *H01L 21/308* | (2006.01) | |
| *H01L 27/22* | (2006.01) | |
| *H01L 29/06* | (2006.01) | |
| *H01L 45/00* | (2006.01) | |

(52) U.S. Cl.
CPC ...... *H01L 27/0886* (2013.01); *H01L 21/3081* (2013.01); *H01L 27/228* (2013.01); *H01L 29/0649* (2013.01); *H01L 45/1206* (2013.01)

(58) Field of Classification Search
CPC ............ H01L 27/0886; H01L 45/1206; H01L 29/0649; H01L 21/3081; H01L 27/228
USPC ....................................................... 257/401
See application file for complete search history.

(56) References Cited

U.S. PATENT DOCUMENTS

| | | | |
|---|---|---|---|
| 5,508,542 A * | 4/1996 | Geiss ................ | H01L 27/10861 257/301 |
| 6,331,467 B1 | 12/2001 | Brown et al. | |
| 8,719,759 B1 * | 5/2014 | Chou ................. | G06F 17/5068 703/15 |
| 2005/0226041 A1 * | 10/2005 | Nejad .................... | B82Y 10/00 365/158 |
| 2006/0244055 A1 * | 11/2006 | Jang .................. | H01L 27/10823 257/330 |
| 2008/0296702 A1 * | 12/2008 | Lee ................. | H01L 21/823431 257/401 |
| 2014/0239396 A1 * | 8/2014 | Liu ................... | H01L 21/28008 257/347 |
| 2014/0256103 A1 * | 9/2014 | Kim ....................... | H01L 21/283 438/270 |
| 2015/0076609 A1 * | 3/2015 | Xie ....................... | H01L 29/785 257/365 |
| 2016/0351565 A1 * | 12/2016 | Sung .................. | H01L 27/0886 |

* cited by examiner

*Primary Examiner* — Marc Armand
*Assistant Examiner* — Sue Tang
(74) *Attorney, Agent, or Firm* — Perkins Coie LLP

(57) ABSTRACT

An electronic device is provided. The electronic device comprises a fin transistor formed over a substrate which is structured to include a device isolation region and an active region, the fin transistor including: a layer formed over the substrate and having a trench crossing the device isolation region and the active region; a gate filled in the trench; a first fin formed over and overlapping the active region and protruding over the device isolation region; and second fins formed on both sidewalls of the first fin in a direction of the trench.

17 Claims, 33 Drawing Sheets

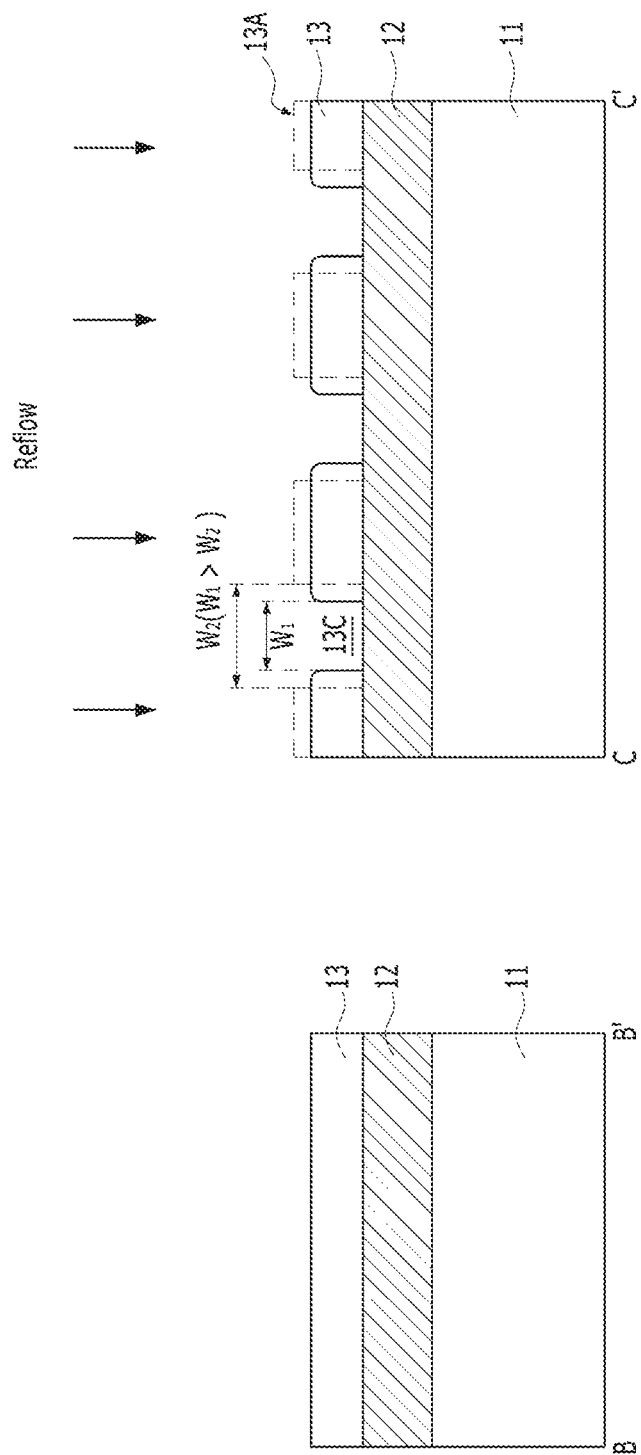

FIN TRANSISTOR, METHOD FOR FABRICATING THE SAME AND ELECTRONIC DEVICE INCLUDING THE SAME

CROSS-REFERENCE TO RELATED APPLICATION

This patent document claims priority of Korean Patent Application No. 10-2015-0189748, entitled "FIN TRANSISTOR, METHOD FOR FABRICATING THE SAME AND ELECTRONIC DEVICE INCLUDING THE SAME" and filed on Dec. 30, 2015, which is incorporated herein by reference in its entirety.

TECHNICAL FIELD

This patent document relates to electronic devices, more specifically a fin transistor, a method for fabricating the fin transistor, and an electronic device including the fin transistor.

BACKGROUND

According to an increase in a memory capacity of a semiconductor device, a density of the device should be increased in order to enhance a degree of integration per unit area. The density of the device may be increased by decrease a size of each device and narrow a distance between the devices. However, when a size of a horizontal channel semiconductor device is decreased, a length of the channel becomes small and a short channel effect occurs. Therefore, a semiconductor device capable of securing an effective channel length and increasing an operating current by forming a fin in a gate, such as a fin transistor is proposed.

SUMMARY

The disclosed technology in this patent document includes memory circuits or devices and their applications in electronic devices or systems and various implementations of an electronic device, in which an electronic device includes a fin transistor which has improved characteristics.

In one aspect, an electronic device comprises a fin transistor formed over a substrate which is structured to include a device isolation region and an active region, the fin transistor including: a layer formed over the substrate and having a trench crossing the device isolation region and the active region; a gate filled in the trench; a first fin formed over and overlapping the active region and protruding over the device isolation region; and second fins formed on both sidewalls of the first fin in a direction of the trench.

Implementations of the above electronic device may include one or more the following.

One or more active regions and one or more device isolation regions extend in a first direction, respectively, and are alternately arranged in a second direction crossing the first direction. One or more gates extend in a second direction and are separately disposed at a predetermined distance in a first direction crossing the second direction. The gate includes a gate dielectric layer formed along the first fin and second fins, a diffusion barrier layer, and a metal-containing layer formed over the diffusion barrier layer and filling a portion of the trench. The fin transistor further comprising a gate protection layer over the gate. The second fins include a silicon-containing layer. The layer includes a semiconductor stack a plurality of silicon-containing layers, and any one silicon-containing layer among the plurality of silicon-containing layers includes a junction layer. The junction layer includes a silicon germanium layer or a silicon carbide layer. The junction layer includes a silicon-containing layer in which an N-type dopant or a P-type dopant is doped. The junction layer includes a silicon-containing layer in which phosphorous (P) is doped. The second fins include a silicon germanium layer. The electronic device further comprises a memory device coupled with the substrate on one side of the gate. The memory device includes a variable resistance element switching between different resistant states according to an applied voltage or current. The variable resistance element includes a first magnetic layer, a second magnetic layer and a tunnel barrier layer interposed between the first magnetic layer and the second magnetic layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating a fin transistor may include forming a gate trench over a substrate having a device isolation region and an active region; forming a first fin and a second fin protruding over the device isolation region by recessing the device isolation region under the gate trench at a predetermined depth; and forming a gate filled in the gate trench.

Implementations of the above method may include one or more the following.

The method may further include preparing a substrate, wherein the preparing the substrate may include: forming a first silicon-containing layer over the substrate; forming a first mask pattern extending in a first direction over the first silicon-containing layer and separately disposed at a predetermined distance in a second direction crossing the first direction; reflowing the first mask pattern; etching the first silicon-containing layer by using the reflowed first mask pattern as an etch barrier; forming a second silicon-containing layer filled in a space between the first silicon-containing layers; forming a third and fourth silicon-containing layers over the second silicon-containing layer; forming a second mask pattern opening a region opposite to the first mask pattern over the fourth silicon-containing layer; defining a device isolation trench and the active region by etching the fourth silicon-containing layer to first silicon-containing layer and a portion of the substrate by using the second mask pattern as an etch barrier; and forming a device isolation region filling the device isolation trench. The method may further include preparing a substrate, wherein the preparing the substrate may include: forming a first silicon-containing layer over the substrate; forming a first mask pattern extending in a first direction over the first silicon-containing layer and separately disposed at a predetermined distance in a second direction crossing the first direction; etching the first silicon-containing layer by using the first mask pattern as an etch barrier; trimming the etched first silicon-containing layer; forming a second silicon-containing layer filled in a space between the trimmed first silicon-containing layer; forming a third and fourth silicon-containing layers over the second silicon-containing layer; forming a second mask pattern opening the same region as the first mask pattern over the fourth silicon-containing layer; defining a device isolation trench and the active region by etching the fourth silicon-containing layer to first silicon-containing layer and a portion of the substrate by using the second mask pattern as an etch mask; and forming a device isolation region filled in the device isolation trench.

The first silicon-containing layer to fourth silicon-containing layer may be formed by epitaxial growth. The first silicon-containing layer may include silicon germanium. The second silicon-containing layer may include silicon. The third silicon-containing layer may include silicon germanium or silicon carbide. The third silicon-containing layer may include a silicon-containing layer in which an N-type dopant or a P-type dopant is doped. The third silicon-containing layer may include a silicon-containing layer in which phosphorous (P) is doped. The fourth silicon-containing layer may include silicon germanium.

These and other aspects, implementations and associated advantages are described in greater detail in the drawings, the description and the claims.

BRIEF DESCRIPTION OF THE DRAWINGS

FIGS. 3A to 3L are cross-sectional views explaining a method for fabricating a fin transistor in accordance with a first implementation of the present disclosure.

DETAILED DESCRIPTION

Figure 1:
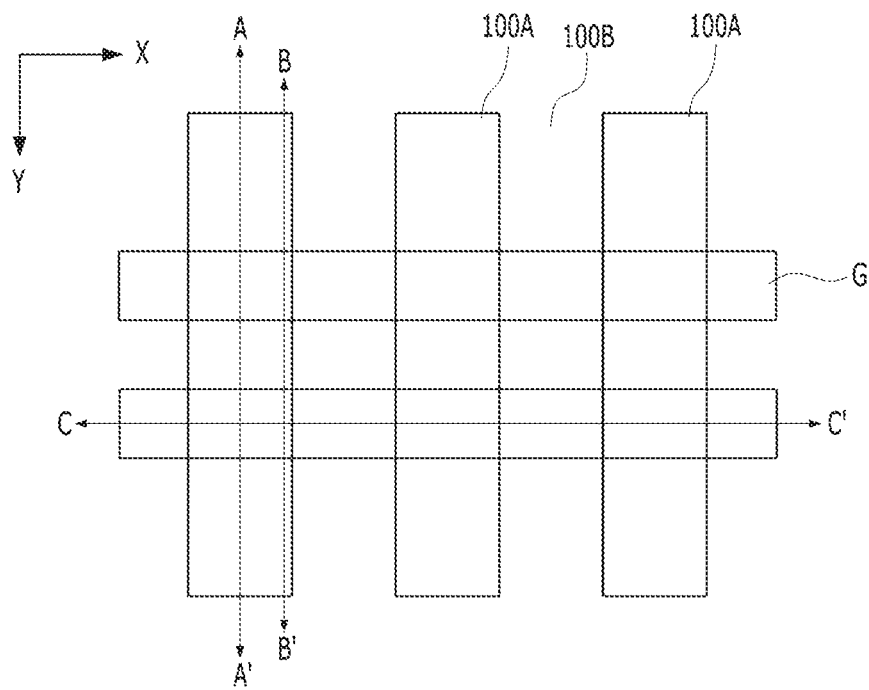
FIG. 1 is a plan view explaining a fin transistor in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on"

or "over" a second layer or "on" or "over" a substrate, the first layer may be directly formed on the second layer or the substrate but may also represent a structure where one or more other intermediate layers may exist between the first layer and the second layer or the substrate.

Figure 2:
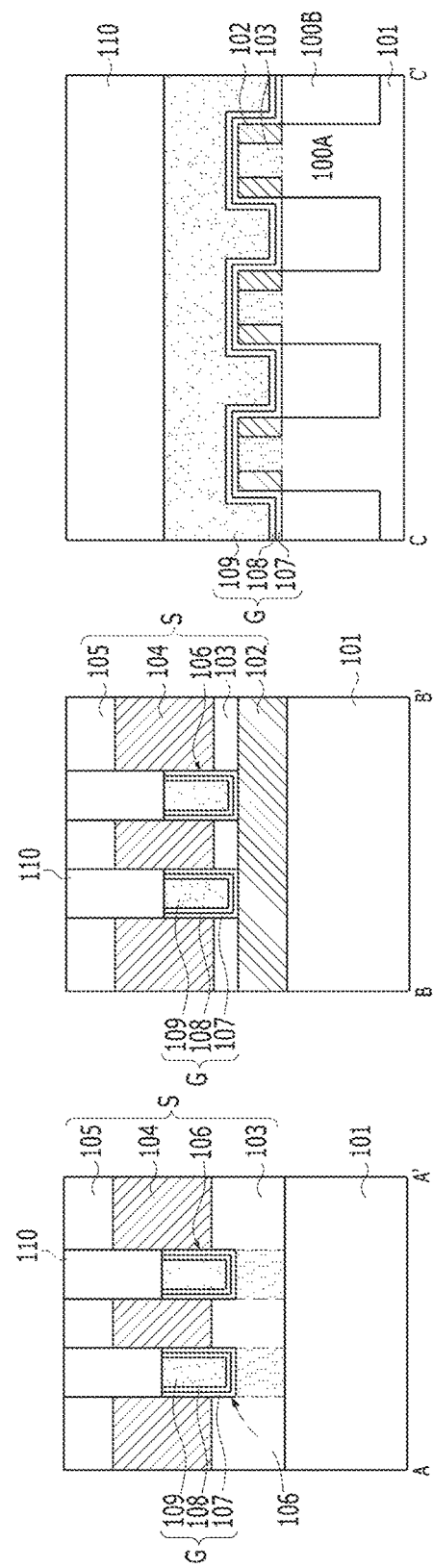
FIG. 2 is a cross-sectional view explaining a fin transistor in accordance with an implementation of the present disclosure.

FIG. 1 is a plan view explaining a fin transistor in accordance with an implementation of the present disclosure. FIG. 2 is a cross-sectional view explaining a fin transistor in accordance with an implementation of the present disclosure. Specifically, FIG. 2 includes three cross-sectional views taken along the line A-A', the line B-B' and the line C-C', respectively.

As shown in FIGS. 1 and 2, a fin transistor in accordance with an implementation of the present disclosure may include a gate extending in a second direction X crossing the active region 100A, of which a portion is filled in a semiconductor stack S formed over a substrate 101 including an active region 100A defined by a device isolation region 100B, and a first fin 103 and a second fin 102 formed in the active region 100A under the gate G.

The active region 100A and the device isolation region 100B may respectively extend in a first direction Y and be separately disposed in the second direction X, as shown by the cross-sectional view taken along the line C-C' in FIG. 2. The active region 100A and the device isolation region 100B may be alternately disposed in the second direction X.

The semiconductor stack S may include a first silicon-containing layer 102, a second silicon-containing layer 103, a third silicon-containing layer 104 and a fourth silicon-containing layer 105 which are formed over a substrate 101.

The first silicon-containing layer 102 may function as an etch stop layer in forming the gate G. The first silicon-containing layer 102 may include a material having etch selectivity with respect to the substrate 101 and at least the second silicon-containing layer 102. The first silicon-containing layer 102 may be formed by epitaxial growth. For example, the first silicon-containing layer 102 may include silicon germanium (SiGe). The first silicon-containing layer 102 may function as an etch stop layer for the gate G as shown in the cross-sectional view taken along the line B-B' to serve to prevent excess etching in forming the gate G. Moreover, as shown in the cross-sectional view taken along the line C-C', the first silicon-containing layer 102 may exist as second fins in a spacer shape on both sidewalls of the first fin 103. A height of the first fin may be determined depending on a height of the first silicon-containing layer 102.

The second silicon-containing layer 103 may function as a first fin for increasing a length of the gate and as a seed layer for growing the third silicon-containing layer 104. The second silicon-containing layer 103 may formed by epitaxial growth. For example, the second silicon-containing layer 103 may include silicon (Si). Second fins 102 in a spacer shape may exist on both sidewalls of the first fin formed by the second silicon-containing layer 103.

The overall line width of the first fin and second fin by the first and second silicon-containing layers 102 and 103 may be the same as the active region 100A and overlap with the active region 100A. And, the first fin and second fin by the first and second silicon-containing layers 102 and 103 may extend in the first direction Y and be separately disposed in the second direction X like the active region 100A.

The third silicon-containing layer 104 may function as a junction of the transistor. The third silicon-containing layer 104 may be formed by epitaxial growth. For example, the third silicon-containing layer 104 may include doped silicon carbide (doped SiC) or doped silicon germanium (doped SiGe). In forming the layer, an impurity may be in-situ doped at a high dose in the third silicon-containing layer 104. Accordingly, the third silicon-containing layer 104 may have an impurity at a high dose which is uniformly doped in the whole layer. For example, the impurity doped in the third silicon-containing layer 104 may include an N-type dopant. The N-type dopant may include, for example, phosphorous (P) and the like.

The fourth silicon-containing layer 105 may function as a sacrificial layer for defining a plug formation region. The fourth silicon-containing layer 105 may be formed by epitaxial growth. The fourth silicon-containing layer 105 may include a material having etch selectivity with respect to the third silicon-containing layer 104.

The semiconductor stack S including the first to fourth silicon-containing layers 102, 103, 104 and 105 may overlap the active region 100A of the substrate 101. A height of the gate G may be determined by heights of the second to fourth silicon-containing layers 103, 104 and 105.

The gate G may include a buried gate which is filled in the semiconductor stack S. The gate G may be filled in a portion of the gate trench 106 and a gate protection layer 110 filled in a remaining portion of the gate trench 106 may be included in an upper portion of the gate G. The gate G may include a gate dielectric layer 107 and a diffusion barrier layer 108 in a liner shape. Moreover, the gate G may include a metal-containing layer 109 formed over the diffusion barrier layer 108 and filled in a portion of the gate trench 106.

The gate dielectric layer 107 may include silicon oxide, silicon nitride, silicon oxynitride, a high-K material or a combination thereof. The high-K material may include a material having a dielectric constant larger than that of silicon oxide. For example, the high-K material may include a material having a dielectric constant more than about 3.9. In another implementation, the high-K material may include a material having a dielectric constant more than about 10. In still another implementation, the high-K material may include a material having a dielectric constant of about 10 to about 30. The high-K material may include at least one metallic element. The high-K material may have a hafnium-containing material. The hafnium-containing material may include hafnium oxide, hafnium silicon oxide, hafnium silicon oxynitride or a combination thereof. In further another implementation, the high-K material may include lanthanum oxide, lanthanum aluminum oxide, zirconium oxide, zirconium silicon oxide, zirconium silicon oxynitride, aluminum oxide, and a combination thereof. Any known high-K material may be selectively used as the high-K material. In this implementation, the gate dielectric layer 107 may be formed by oxidizing a surface of the gate trench 106. In another implementation, the gate dielectric layer 107 may include silicon oxide which is formed by oxidizing liner polysilicon. In still another implementation, the gate dielectric layer 107 may include silicon oxide which is formed by oxidizing liner nitride.

The diffusion barrier layer 108 may serve to maintain the metal ions in the metal-containing layer 109 and prevent a metal ion in the metal-containing layer 109 from out-diffusion. The diffusion barrier layer 108 may include a conductive material. The diffusion barrier layer 108 may include, for example, titanium (Ti) and the like.

The metal-containing layer 109 may include a conductive material containing a metal and having a low resistance. The metal-containing layer 109 may include titanium nitride, tungsten or a combination thereof. The metal-containing layer 109 may be a metallic material having a work function. The metal-containing layer 109 may have an N-type work function or a P-type work function. When an NMOSFET is formed, the metal-containing layer 109 may have an N-type work function. When a PMOSFET is formed, the metal-containing layer 109 may have a P-type work function. For work function engineering, various materials having work functions may be used.

The gate protection layer 110 is formed over the gate G and may include a dielectric material. The gate protection layer 110 may include silicon nitride, silicon oxynitride or a combination thereof. In another implementation, the gate protection layer 110 may include a combination of silicon nitride and silicon oxide. For example, the gate protection layer 110 may be formed by lining with silicon nitride and then filling with a spin on dielectric (SOD) material. In another implementation, the gate protection layer 110 may be an ONO (Oxide-Nitride-Oxide) structure.

FIGS. 3A to 3L are cross-sectional views explaining a method for fabricating a fin transistor in accordance with a first implementation of the present disclosure. FIGS. 3A to 3L are cross-sectional views taken along the lines B-B' and C-C' of FIG. 1.

Figure 3A:
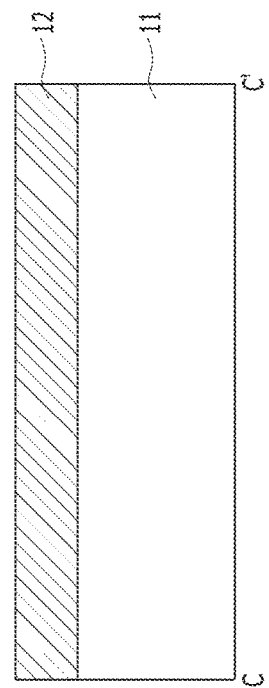
Figure 3A:
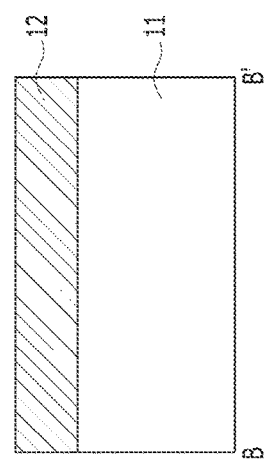

As shown in FIG. 3A, a substrate 11 may be prepared. The substrate 11 may include a semiconductor substrate. The substrate 11 may include a semiconductor material such as silicon and the like.

Then, a first silicon-containing layer 12 may be formed over the substrate 11. The first silicon-containing layer 12 may function an etch stop layer in a subsequent gate process. The first silicon-containing layer 12 may include a material having etch selectivity with respect to the substrate 11. The first silicon-containing layer 12 may be formed by epitaxial growth. The first silicon-containing layer 12 may include, for example, silicon germanium (SiGe).

Figure 3B:
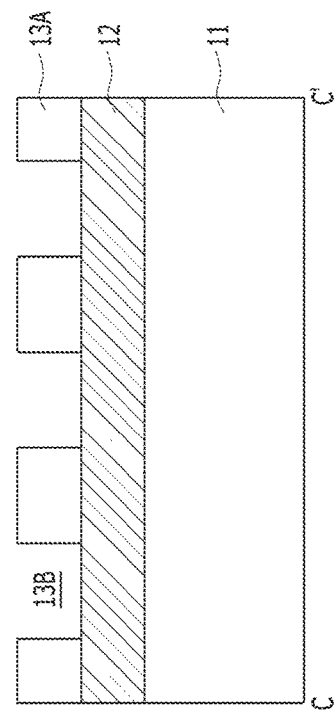
Figure 3B:
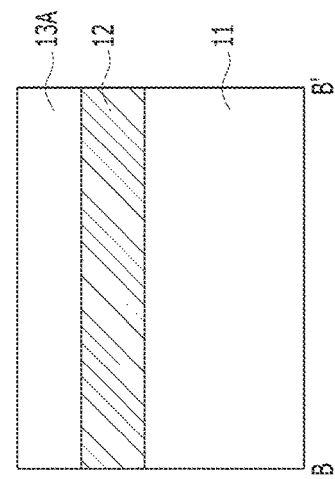

As shown in FIG. 3B, a first preliminary mask pattern 13A may be formed over the first silicon-containing layer 12. The first preliminary mask pattern 13A may have at least one or more first opening 13B. The first opening 13B may have a line shape. The first preliminary mask pattern 13A may be formed by a photolithography process. The first preliminary mask pattern 13A may include a photoresist. The first opening 13B of the first preliminary mask pattern 13A may extend in the first direction Y.

The first preliminary mask pattern 13A may function as an etch barrier for forming a second fin. In consideration of a reflow process to be subsequently performed and a height of a layer to be etched, for example, the first silicon-containing layer 12, a height of the first preliminary mask pattern 13A may be adjusted so as to secure a sufficient etch margin.

As shown in FIG. 3C, a first mask pattern 13 may be formed. In order to form the first mask pattern 13, the first preliminary mask pattern 13A (See, FIG. 3B) may be exposed to a reflow process. The first mask pattern 13 may have a second opening 13C. The second opening 13C may have a line shape. The second opening 13C may extend in the first direction Y.

The second opening 13C of the first mask pattern 13 may have a line width smaller than that of the first opening 13B (See, FIG. 3B) of the first preliminary mask pattern 13A (See, FIG. 3B) (W2>W1). Further, the second opening 13C of the first mask pattern 13 may have a height lower than that of the first opening 13B of the first preliminary mask pattern 13A.

Figure 3D:
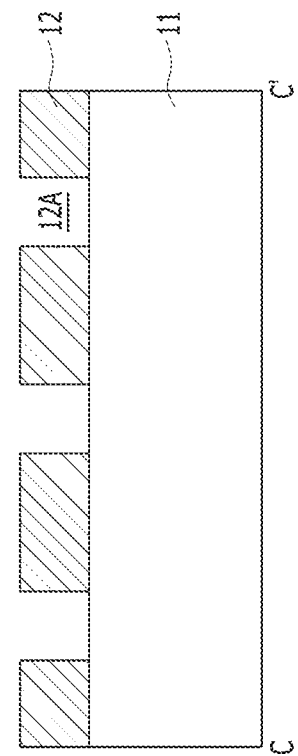
Figure 3D:
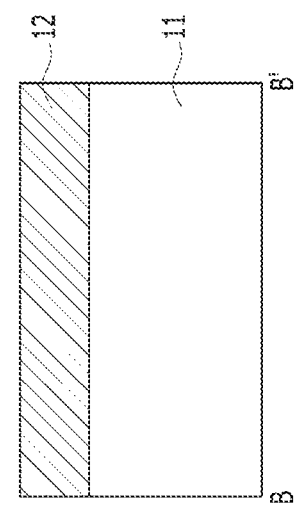

As shown in FIG. 3D, a third opening 12A may be formed over the first silicon-containing layer 12. In order to form the third opening 12A, the first silicon-containing layer 12 may be etched. For example, the first silicon-containing layer 12 may be etched by using the first mask pattern 13 (See, FIG. 3C) as an etch barrier. Accordingly, at least one or more third opening 12A exposing a portion of a surface of the substrate 11 may be formed. The third opening 12A may have a line shape. The third opening 12A may extend in the second direction like the second opening 13C (See, FIG. 3C). The third opening 12A and the second opening 13C may have the same line width as each other.

Then, the first mask pattern 13 may be removed. In case that the first mask pattern 13 may include a photoresist, it may be removed by a dry strip process. For example, the dry strip process may include an oxygen strip process.

A series of processes for etching the first mask pattern 13 and the first silicon-containing layer 12 are performed in the active region 100A (See, FIG. 1). As shown in the cross-sectional view taken along the line B-B', the second fin region is protected by the first mask pattern 13 and thus, is not subject to the etch process.

Figure 3E:
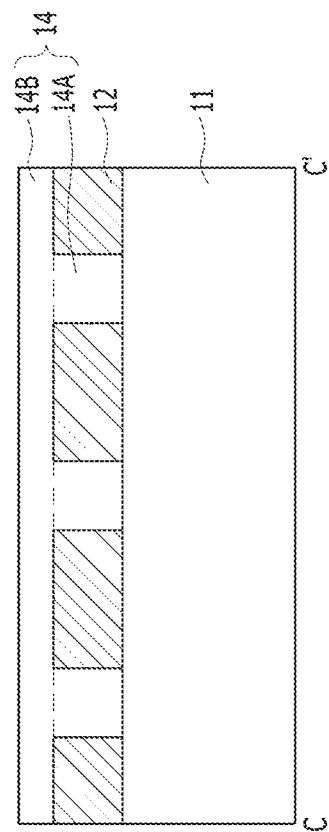
Figure 3E:
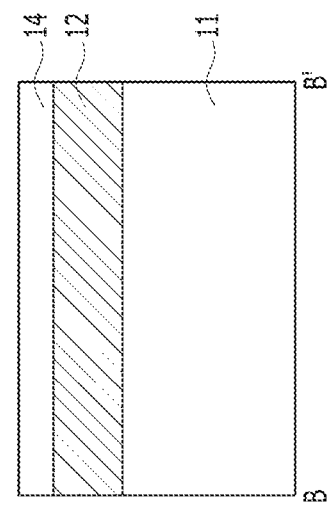

As shown in FIG. 3E, a second silicon-containing layer 14 may be formed. The second silicon-containing layer 14 may include a first portion 14A and a second portion 14B. The first portion 14A of the second silicon-containing layer 14 may fill the third opening 12A. The second portion 14B of the second silicon-containing layer 14 may cover a top surface of the first silicon-containing layer 13 and the first portion 14A. The second silicon-containing layer 14 may be formed so as to have a thickness larger than that of the first silicon-containing layer 13. The second silicon-containing layer 14 may be different from the first silicon-containing layer 13. The second silicon-containing layer 14 may include, for example, silicon (Si). The second silicon-containing layer 14 may be formed by epitaxial growth.

Figure 3F:
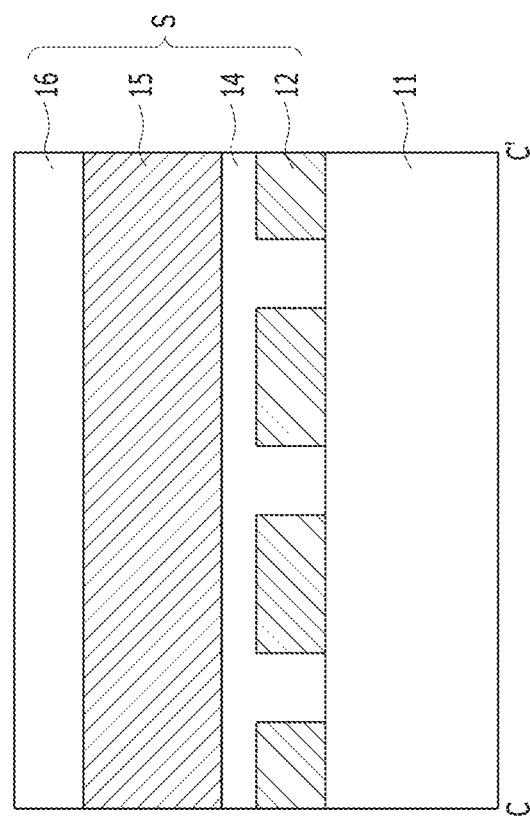
Figure 3F:
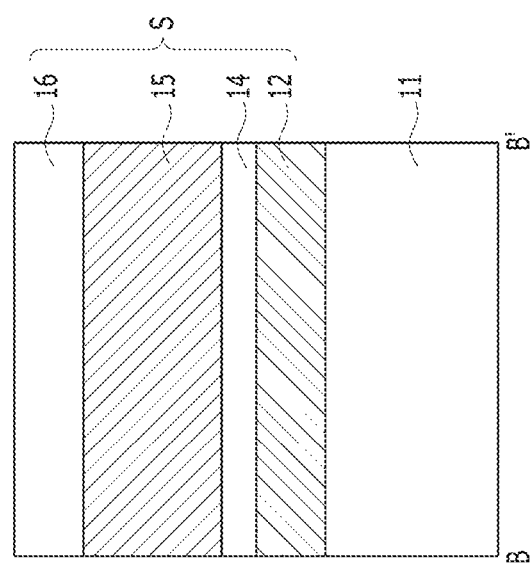

As shown in FIG. 3F, a third silicon-containing layer 15 may be formed over the second silicon-containing layer 14. The third silicon-containing layer 15 may be in situ formed after the second silicon-containing layer 14 is formed. The third silicon-containing layer 15 may be formed by epitaxial growth. The third silicon-containing layer 15 may be a doped silicon-containing layer. The third silicon-containing layer 15 may include an N-type dopant or a P-type dopant. The third silicon-containing layer 15 may include a dopant such as arsenic (As), phosphorous (P), boron (B) and the like. The formation of the third silicon-containing layer 15 may include in situ doping. For example, phosphine (Ph3) may be in situ provided during the epitaxial growth of the third silicon-containing layer 15. The third silicon-containing layer 15 may function as a junction for a transistor to be formed through a subsequent process. The third silicon-containing layer 15 may include silicon carbide (SiC) or silicon germanium (SiGe). In this implementation, it is possible to dope at a high dose and obtain a uniform doping concentration throughout the layer by performing an in situ doping in forming the third silicon-containing layer 15.

Then, a fourth silicon-containing layer 16 may be formed over the third silicon-containing layer 15. The fourth silicon-containing layer 16 may function as a sacrificial layer for defining a plug region. The fourth silicon-containing layer 16 may include a material having etch selectivity with respect to the third silicon-containing layer 15. For example, although the fourth silicon-containing layer 16 may include undoped silicon germanium (undoped SiGe), the present disclosure is not limited thereto and any materials capable of easily removing by using etch selectivity with respect to the third silicon-containing layer 15 may be employed. A height of the fourth silicon-containing layer 16 may be adjusted in consideration of a height of a plug to be subsequently formed.

The semiconductor stack S may be formed by a series of processes as described above. The semiconductor stack S may include the first silicon-containing layer 12, the second silicon-containing layer 14, the third silicon-containing layer 15 and the fourth silicon-containing layer 16. The semiconductor stack S may function as an active region together with the substrate 11.

Figure 3G:
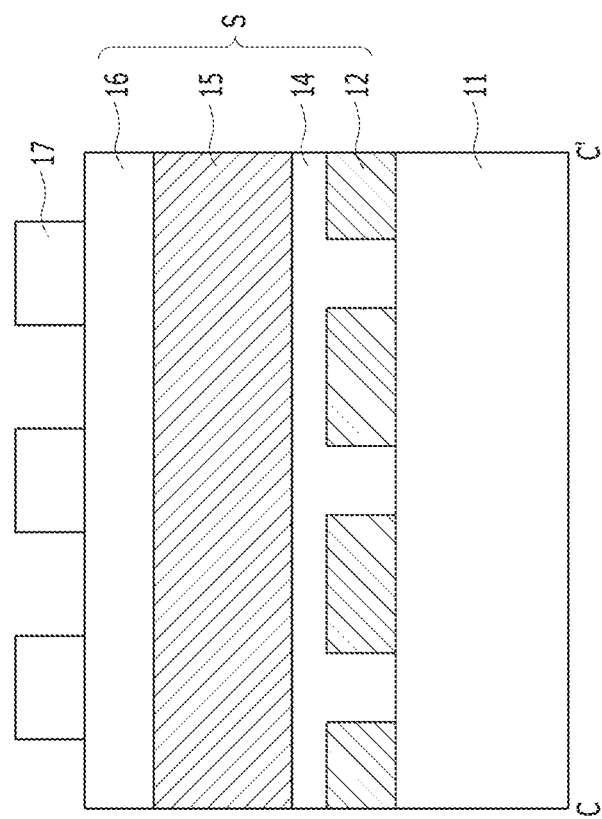
Figure 3G:
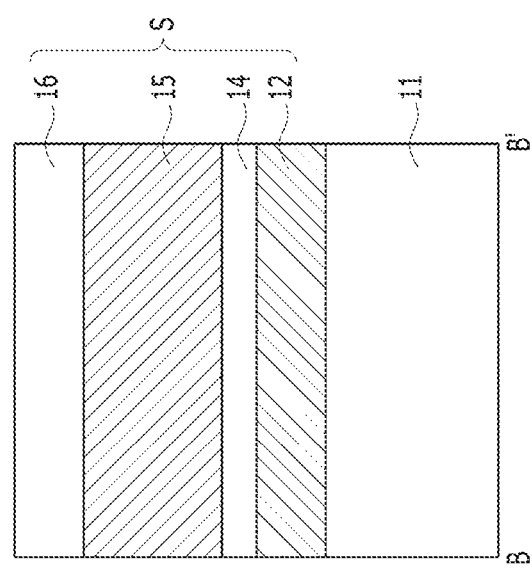

As shown in FIG. 3G, a second mask pattern 17 may be formed over the fourth silicon-containing layer 16. The second mask pattern 17 may be formed by a photolithography process. The second mask pattern 17 may include a photoresist. The second mask pattern 17 may extend in the first direction Y. An opening by the second mask pattern 17 may be a device isolation region. The second mask pattern 17 may overlap with the first portion 14A of the second silicon-containing layer 14. Moreover, the second mask pattern 17 may overlap with a portion of the first silicon-containing layer 12.

Figure 3H:
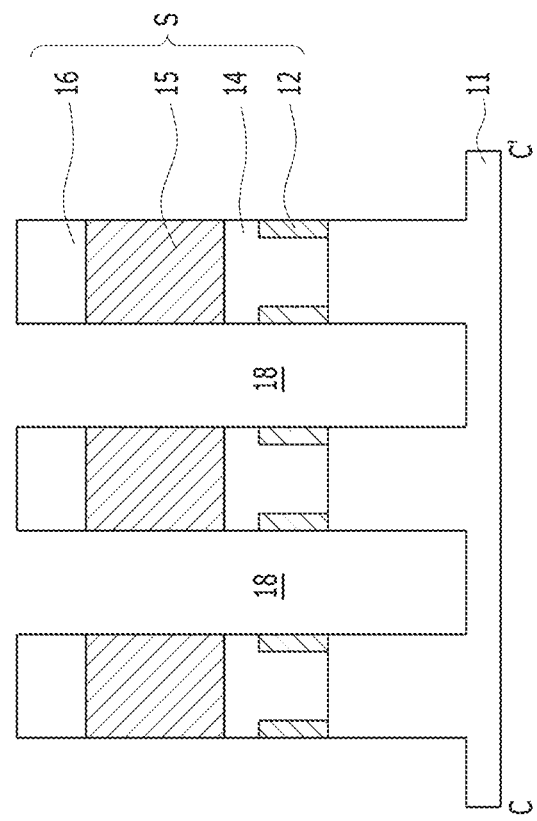
Figure 3H:
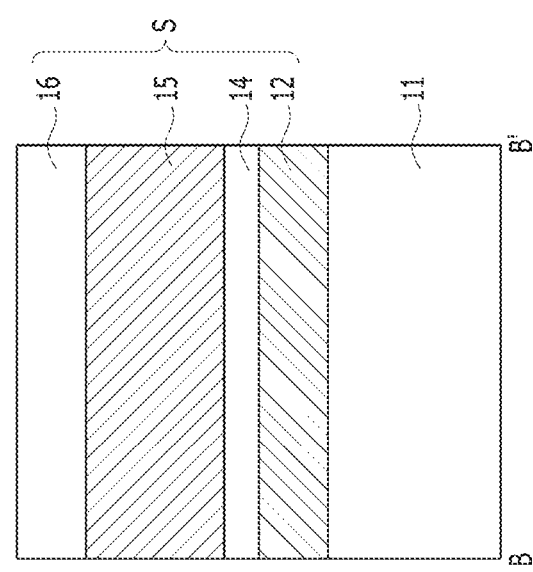

As shown in FIG. 3H, a first trench 18 may be formed in the semiconductor stack S and the substrate 11. The first trench 18 may be formed by a series of etch processes for etching the semiconductor stack S and the substrate 11 by using the second mask pattern 17 (See, FIG. 3G) as an etch barrier. An active region may be defined by the first trench 18. The first trench 18 may extend in the first direction Y.

Then, the second mask pattern 17 may be removed. When the second mask pattern 17 includes a photoresist, it may be removed by a dry strip process. For example, the dry strip process may include an oxygen strip process.

When the formation of the first trench 18 is completed, the first silicon-containing layer 12 may not be completely removed and remain in a spacer shape on both sidewalls of the first portion 14A of the second silicon-containing layer 14.

Figure 3I:
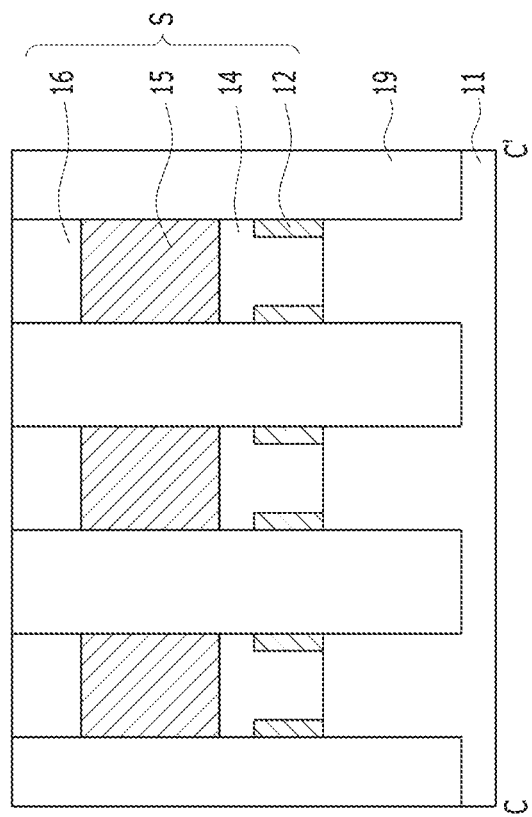
Figure 3I:
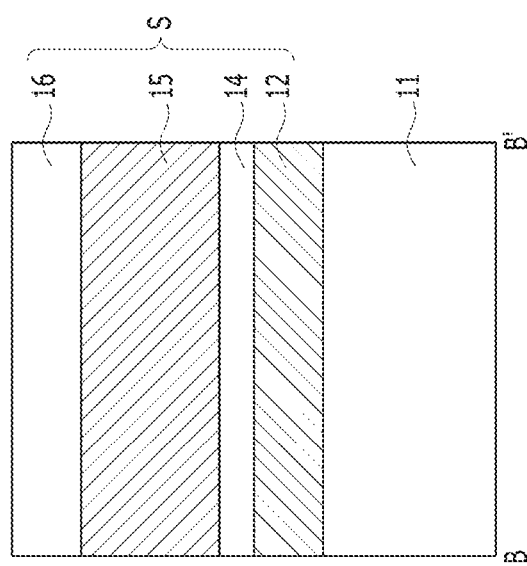

As shown in FIG. 3I, a device isolation region 19 filling the first trench 18 may be formed. The device isolation region 19 may be formed by a series of processes for filling the first trench 18 with a dielectric material and isolating the dielectric materials filled in each first trench 18 from each other. The device isolation region 19 may include silicon oxide, silicon nitride or a combination thereof.

Figure 3J:
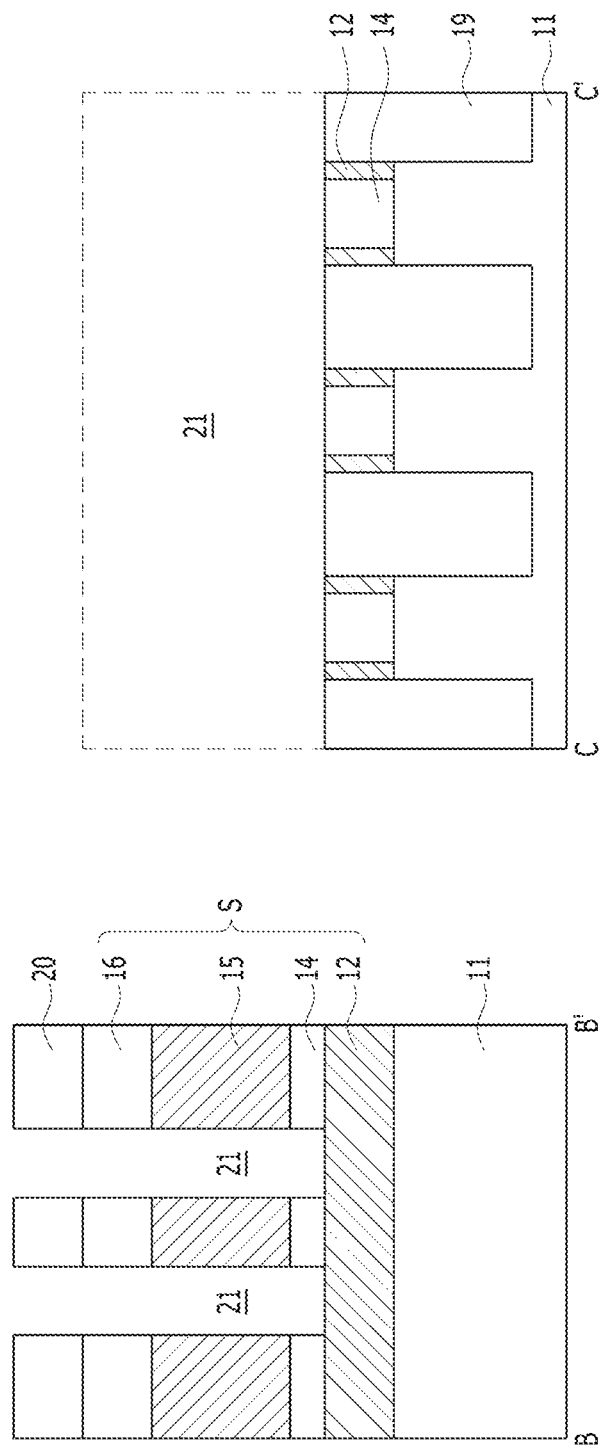

As shown in FIG. 3J, a third mask pattern 20 may be formed over the fourth silicon-containing layer 16 and the device isolation region 19. The third mask pattern 20 may be formed by a photolithography process. The third mask pattern 20 may include a photoresist. The third mask pattern 20 may extend in the second direction X.

Then, a second trench 21 may be formed by etching the fourth silicon-containing layer 16 to the second silicon-containing layer 14 by using the third mask pattern 20 as an etch barrier. The second trench 21 may be a region in which a buried gate is formed through a subsequent process. The etch process for forming the second trench 21 may be performed by separately performing etch processes for the fourth silicon-containing layer 16, the third silicon-containing layer 15 and the second silicon-containing layer 14, respectively. In particular, the etch process may be performed by adjusting etch selectivity so that the first silicon-containing layer 12 may function as an etch stop layer for the second trench 21.

Figure 3K:
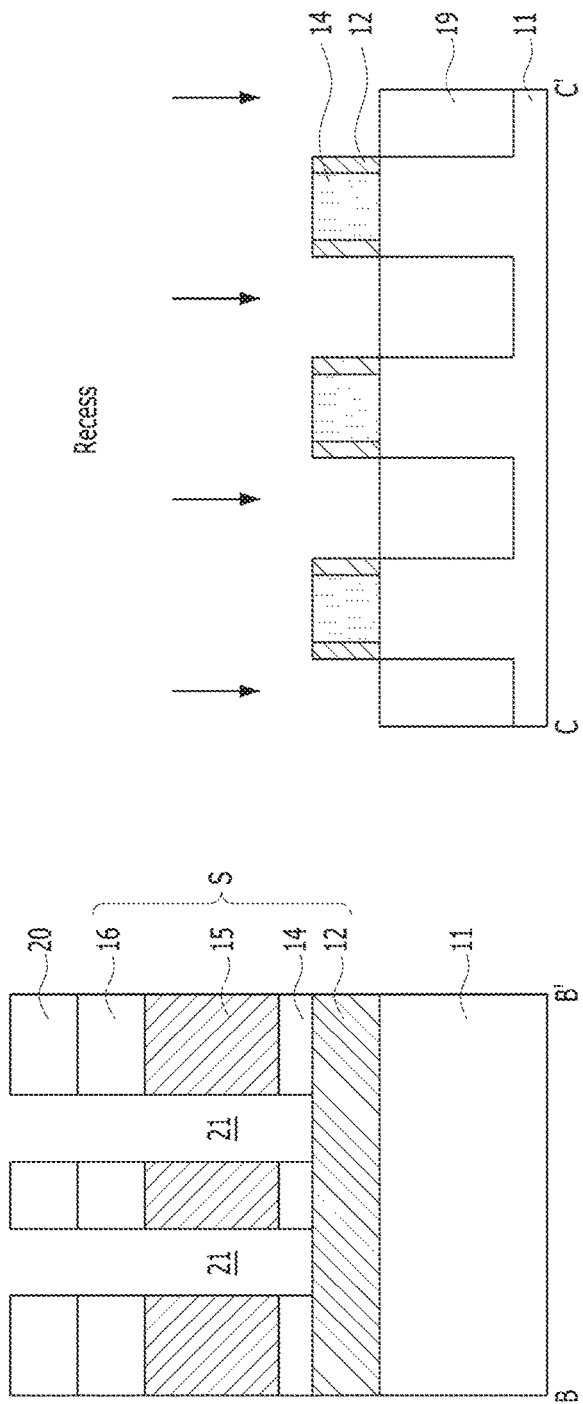

As shown in FIG. 3K, the device isolation region 19 may be recessed at a predetermined depth. As the device isolation region 19 is recessed, the first and second silicon-containing layers 12 and 14 protrude over the device isolation region 19 and thus, a first fin and second fin structure may be formed.

Figure 3L:
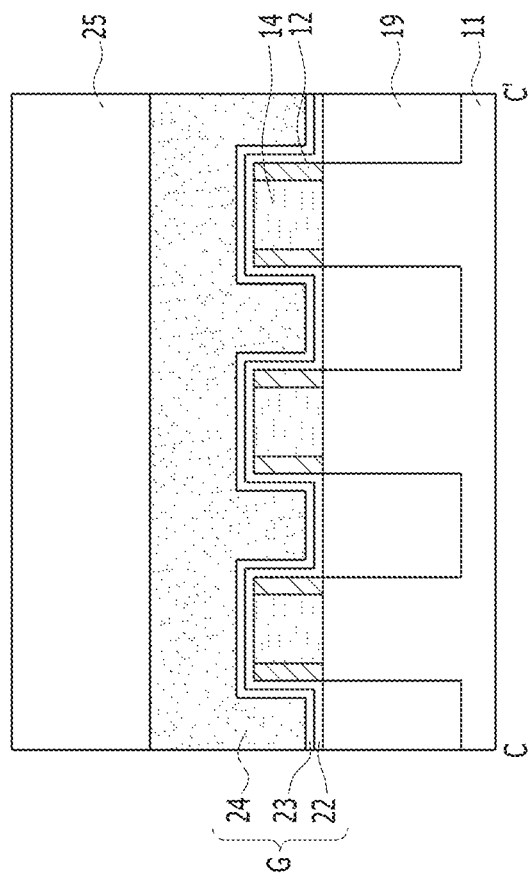
Figure 3L:
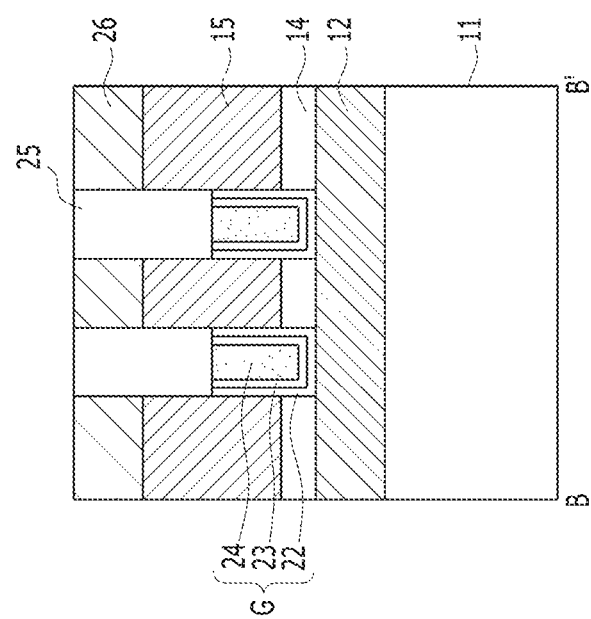

As shown in FIG. 3L, the third mask pattern 20 shown in FIG. 3K may be removed. When the third mask pattern 20 includes a photoresist, it may be removed by a dry strip process. For example, the dry strip process may include an oxygen strip process.

Then, a gate G filling the second trench 21 and a gate protection layer 25 may be formed. The gate G may be a buried gate filling a portion of the second trench 21. The gate G may include a gate dielectric layer 22, a diffusion barrier layer 23 and a metal-containing layer 24.

In forming the gate G, the gate dielectric layer 22 and the diffusion barrier layer 23 in a liner shape may be first formed along a front surface of the second trench 21. Next, the metal-containing layer 24 filling the second trench 21 may be formed over the diffusion barrier layer 23. Then, an isolation process may be performed to isolate the metal-containing layer 24, the diffusion barrier layer 23 and the gate dielectric layer 22 from the neighboring second trench 21. Finally, the metal-containing layer 24, the diffusion barrier layer 23 and the gate dielectric layer 22 may be recessed at a predetermined depth so as to fill only a portion of the second trench 21.

The gate dielectric layer 22 may include material materials, e.g., silicon oxide, silicon nitride, silicon oxynitride, a high-K material or a combination thereof. The high-K material may include a material having a dielectric constant larger than that of silicon. For example, the high-K material may include a material having a dielectric constant more than about 3.9. In another implementation, the high-K material may include a material having a dielectric constant more than about 10. In still another implementation, the high-K material may include a material having a dielectric constant of about 10 to about 30. The high-K material may include at least one metallic element. The high-K material may include, for example, a hafnium-containing material. The hafnium-containing material may include hafnium oxide, hafnium silicon oxide, hafnium silicon oxynitride or a combination thereof. In another implementation, the high-K material may include lanthanum oxide, lanthanum aluminum oxide, zirconium oxide, zirconium silicon oxide, zirconium silicon oxynitride, aluminum oxide or a combination thereof. Other high-K materials may be employed as the high-K material. In this implementation, the gate dielectric layer 22 may be formed by oxidizing a surface of the second trench 21. In another implementation, the gate dielectric layer 22 may include silicon oxide formed by oxidizing liner polylsilicon. In still another implementation, the gate dielectric layer 22 may include silicon oxide formed by oxidizing liner nitride.

The metal-containing layer 24 may be a silicon-based material, a metal-based material or a combination thereof. The metal-containing layer 24 may include titanium nitride, tungsten or a combination thereof. The metal-containing layer 24 may be a metallic material having a work function. The metal-containing layer 24 may have an N-type work function or a P-type work function. When an NMOSFET is formed, the metal-containing layer 24 may have an N-type work function. When a PMOSFET is formed, the metal-containing layer 24 may have a P-type work function. For work function engineering, various materials having work functions may be used.

The gate protection layer 25 may be formed over the gate G. The gate protection layer 25 may be formed by a series of processes for filling a remaining portion of the second trench 21 over the gate G and then isolating the gate protection layer 25 from the neighboring second trench 21. The gate protection layer 25 may serve to protect the gate G. The gate protection layer 25 may include a dielectric material. The gate protection layer 25 may include silicon nitride, silicon oxynitride or a combination thereof. In another implementation, the gate protection layer 25 may include a combination of silicon nitride and silicon oxide. For example, the gate protection layer 25 may be formed by lining with silicon nitride and then filling with a spin on dielectric (SOD) material. In another implementation, the gate protection layer 25 may have an ONO (oxide-nitride-oxide) structure.

Next, the fourth silicon-containing layer 16 shown in FIG. 3K may be removed. The fourth silicon-containing layer 16 may be formed of a material having etch selectivity with respect to the third silicon-containing layer 15 and capable of being easily removed so that it may be easily removed by a etch process or a wash process. A plug region may be formed over the third silicon-containing layer 15 functioning as a junction by removing the fourth silicon-containing layer 16.

As illustrated in FIG. 3L, a plug 26 may be formed in a region in which the fourth silicon-containing layer 16 is removed. The plug 26 may include a conductive material. The plug 26 may serve to reduce an interfacial resistance with an upper layer to be formed by a subsequent process. The plug 26 may include, for example, polysilicon or a metal-containing layer.

By the above implementation, it is possible to secure an effective channel length and increase an operating current by forming a fin transistor which has improved characteristics.

FIGS. 4A to 4M are cross-sectional views explaining a method for fabricating a fin transistor in accordance with a second implementation of the present disclosure. FIGS. 4A to 4M are cross-sectional views taken along the line B-B' and the line C-C' of FIG. 1.

Figure 4A:
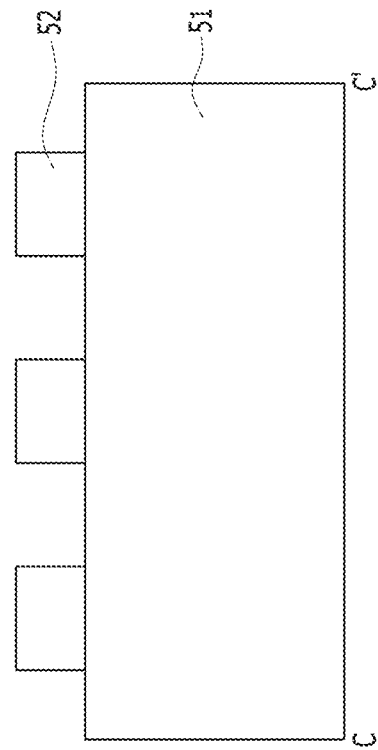
FIGS. 4A to 4M are cross-sectional views explaining a method for fabricating a fin transistor in accordance with a second implementation of the present disclosure.
Figure 4A:
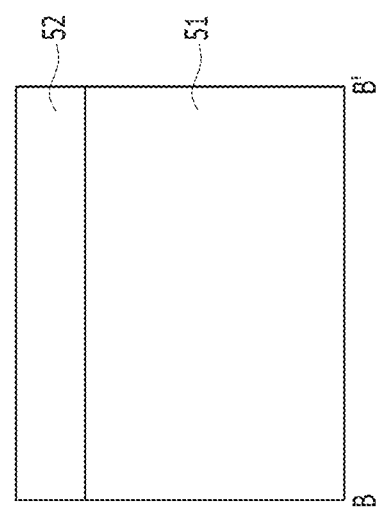

As shown in FIG. 4A, a substrate 51 may be prepared. The substrate 51 may include a semiconductor substrate. The substrate 51 may include various semiconductor materials such as silicon, etc.

Then, a first mask pattern 52 may be formed over the substrate 51. The first mask pattern 52 may be formed by a photolithography process. The first mask pattern 52 may include a photoresist. The first mask pattern 52 may extend in the first direction Y.

Figure 4B:
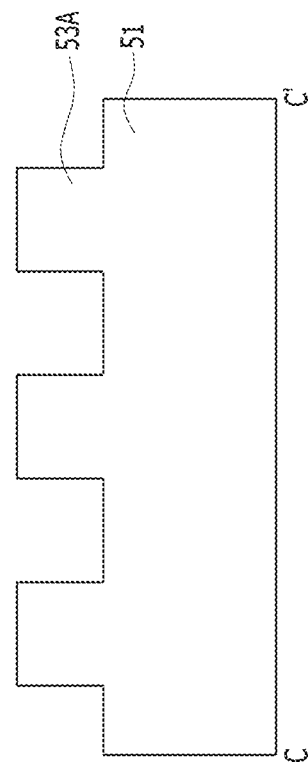
Figure 4B:
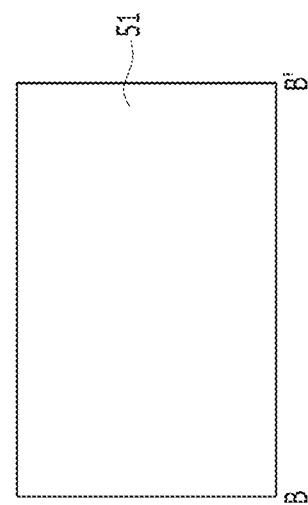

As shown in FIG. 4B, the substrate 51 may be etched at a predetermined depth by using the first mask pattern 52 (See, FIG. 5A) as an etch barrier. As a result, a protruding portion 53A may be formed over the substrate 51. A height of the protruding portion 53A may be adjusted in consideration of a subsequent trimming process.

Then, the first mask pattern 52 may be removed. When the first mask pattern 52 includes a photoresist, it may be removed by a dry strip process. For example, the dry strip process may include an oxygen strip process.

Figure 4C:
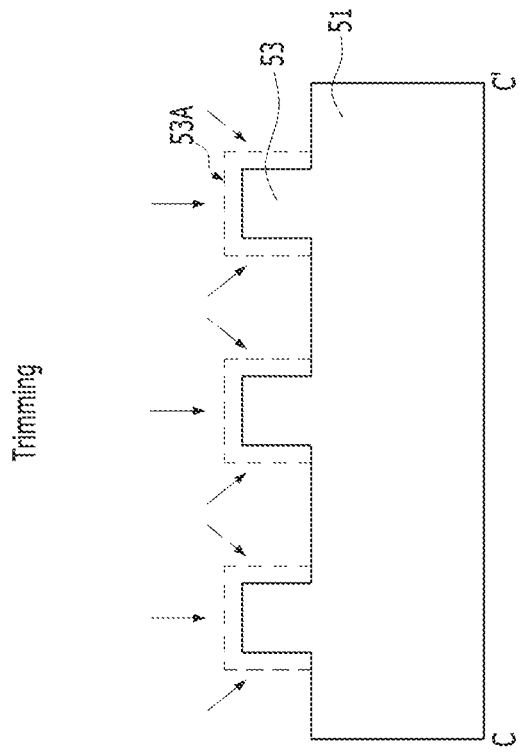
Figure 4C:
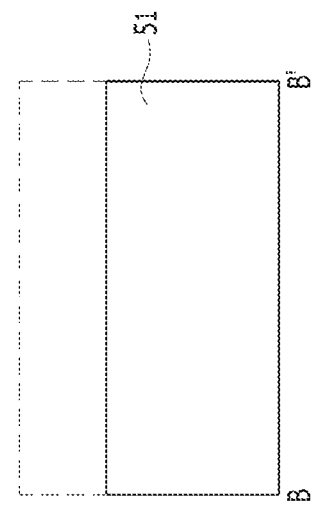
Figure 4D:
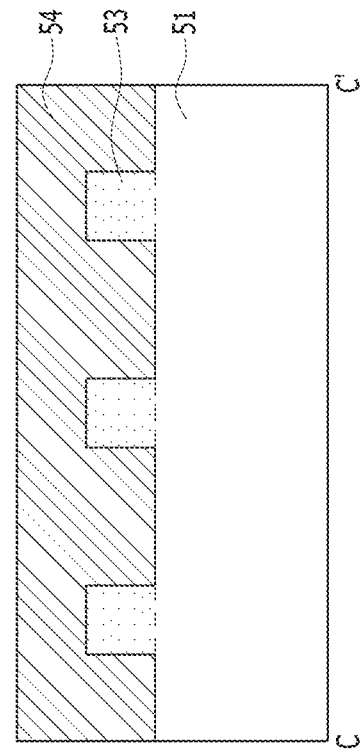
Figure 4D:
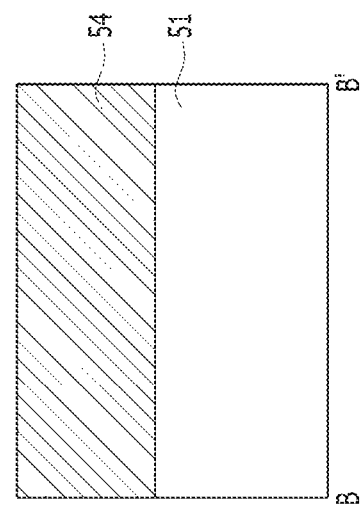

As shown in FIG. 4C, a trimming process may be performed. Due to the trimming process, a height and a line width of the protruding portion 53A (See, FIG. 4B) may be decreased. The trimming process may be performed by an isotropic etch process. The trimming process may be performed so as to sufficiently secure a gate length in consideration of a height and a line width of the first fin.

A protruding portion 53 in which the trimming process is completed may function as a fin of a transistor in a subsequent process.

As shown in FIG. 4B, a first silicon-containing layer 54 may be formed over the substrate 51 including the protruding portion 53. The first silicon-containing layer 54 may function as an etch stop layer in a subsequent gate process. The first silicon-containing layer 54 may include a material having etch selectivity with respect to the substrate 51. The first silicon-containing layer 54 may be formed by epitaxial growth. The first silicon-containing layer 54 may include, for example, silicon germanium (SiGe). The first silicon-containing layer 54 may be formed at a thickness allowing a whole space between at least the protruding portions 53 to be filled.

Figure 4E:
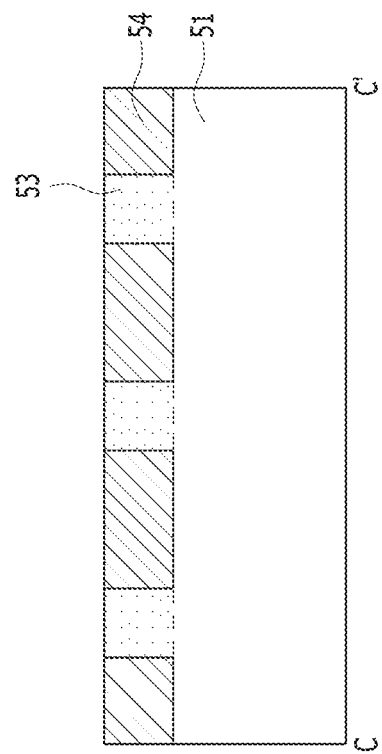
Figure 4E:
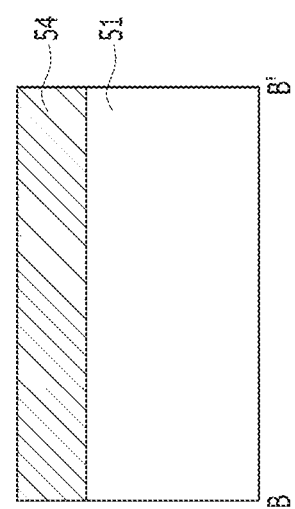

As shown in FIG. 4E, an isolation process may be performed over the first silicon-containing layer 54. The isolation process may be performed so as to expose the protruding portion 53. The isolation process may include, for example, a chemical mechanical polishing process or an etch back process and the like. Through the isolation process, the first silicon-containing layer 54 may remain at a thickness allowing a space between the protruding portions 53 to be filled.

Figure 4F:
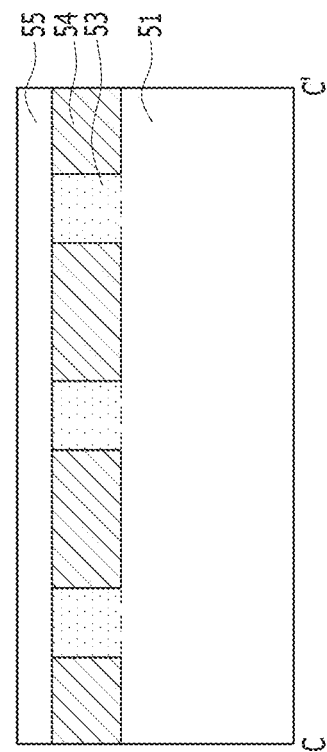
Figure 4F:
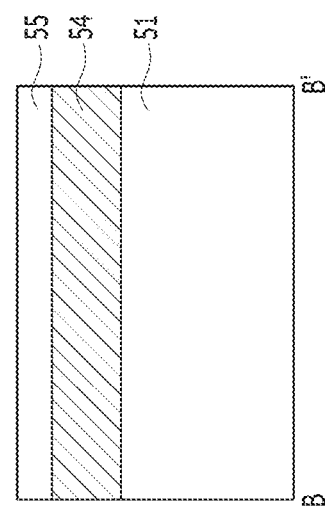

As shown in FIG. 4F, a second silicon-containing layer 55 may be formed over the protruding portion 53 and the first silicon-containing layer 54. The second silicon-containing layer 55 may function as a seed layer in forming a subsequent third silicon-containing layer. The second silicon-containing layer 55 may include, for example, silicon (Si). The second silicon-containing layer 55 may be formed by epitaxial growth.

Figure 4G:
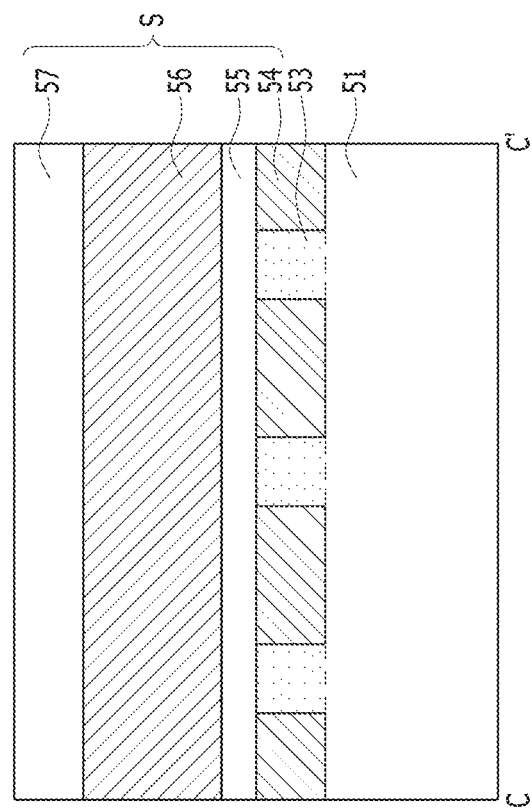
Figure 4G:
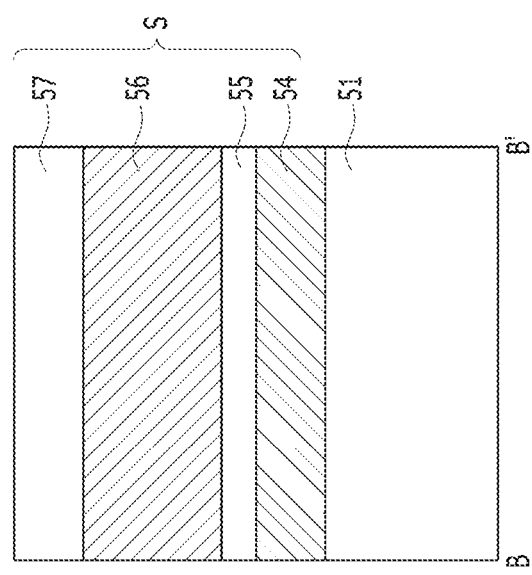

As shown in FIG. 4G, a third silicon-containing layer 56 may be formed over the second silicon-containing layer 55. The third silicon-containing layer 56 may be in situ formed after forming the second silicon-containing layer 55. The third silicon-containing layer 56 may be formed by epitaxial growth. The third silicon-containing layer 56 may be a doped silicon-containing layer. The third silicon-containing layer 56 may include an N-type dopant or a P-type dopant. The third silicon-containing layer 56 may include a dopant such as arsenic (As), phosphorous (P) or boron (B), etc. The formation of the third silicon-containing layer 56 may include in situ doping. For example, phosphine (Ph3) may be in situ provided during the epitaxial growth of the third silicon-containing layer 56. The third silicon-containing layer 56 may function as a junction for a transistor to be formed through a subsequent process. The third silicon-containing layer 56 may include silicon carbide (SiC) or silicon germanium (SiGe). In this implementation, since the in situ doping is performed in forming the third silicon-containing layer 56, the doping may be performed at a high concentration and a uniform doping concentration may be obtained throughout the layer.

Then, a fourth silicon-containing layer 57 may be formed over the third silicon-containing layer 56. The Fourth silicon-containing layer 57 may function as a sacrificial layer for defining a plug region. The fourth silicon-containing layer 57 may include a material having etch selectivity with respect to the third silicon-containing layer 56. For example, the fourth silicon-containing layer 57 may include undoped silicon germanium (undoped SiGe), however the present disclosure is not limited thereto. Any material capable of being easily removed by using etch selectivity with respect to the third silicon-containing layer 56 may be employed. The fourth silicon-containing layer 57 may be adjusted in consideration of a height of a plug to be subsequently formed.

The semiconductor stack S may be formed by a series of processes as described above. The semiconductor stack S may include the first silicon-containing layer 54, the second silicon-containing layer 55, the third silicon-containing layer 56 and the fourth silicon-containing layer 57. The semiconductor stack S may function as an active region together with the substrate 51.

Figure 4H:
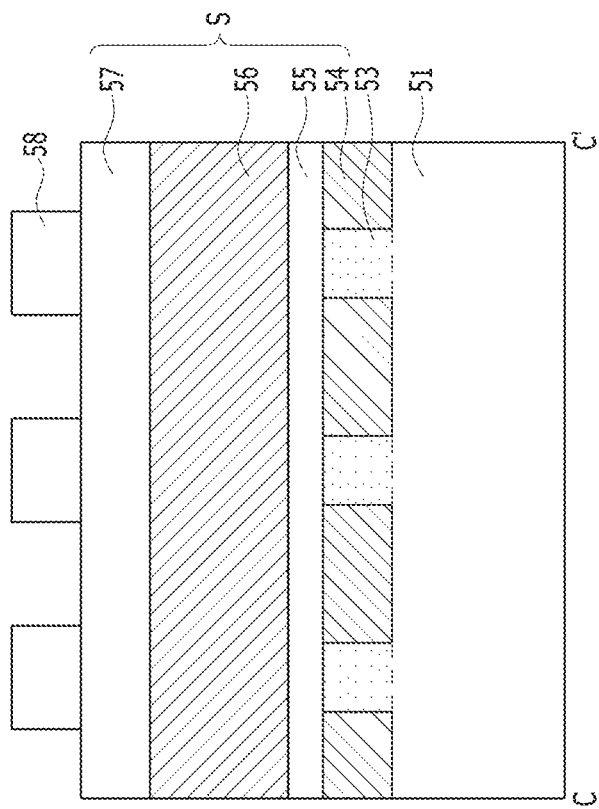
Figure 4H:
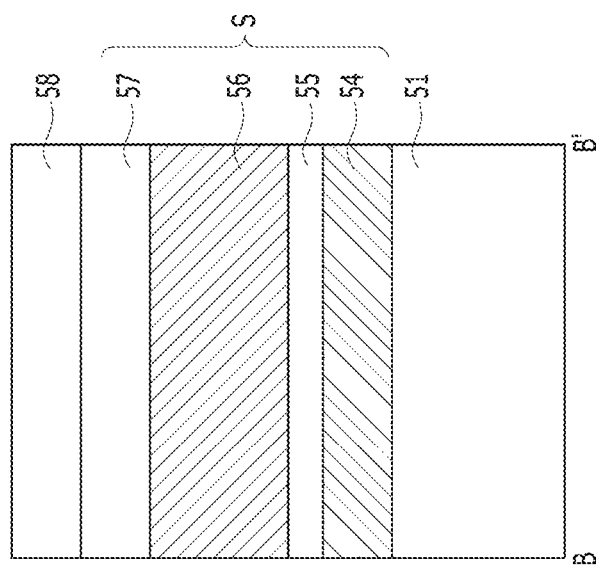

As shown in FIG. 4H, a second mask pattern 58 may be formed over the fourth silicon-containing layer 57. The second mask pattern 58 may be formed by a photolithography process. The second mask pattern 58 may include a photoresist. The second mask pattern 58 may extend in the first direction Y. An opening by the second mask pattern 58 may be a device isolation region. The second mask pattern 58 may overlap with the protruding portion 53. Moreover, the second mask pattern 58 may overlap with a portion of the first silicon-containing layer 54.

Figure 4I:
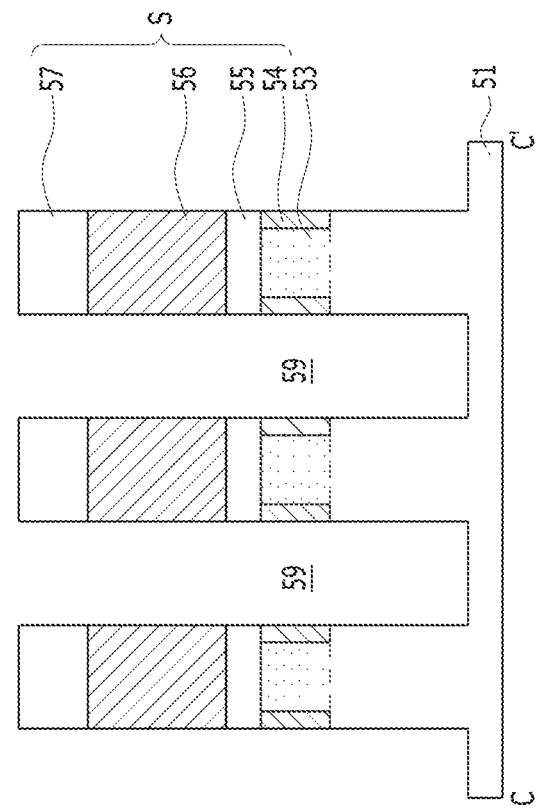
Figure 4I:
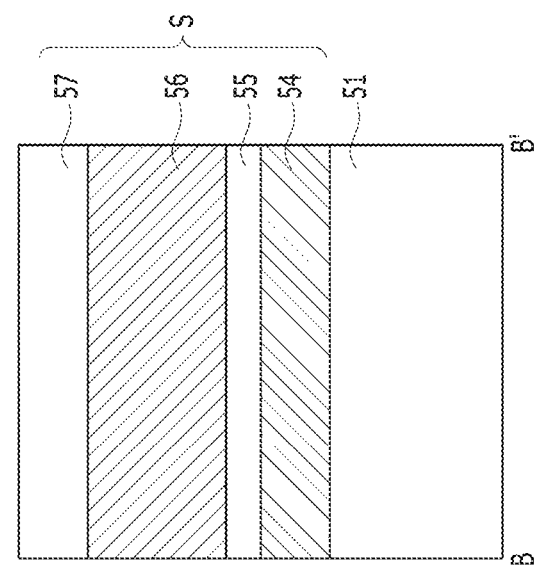

As shown in FIG. 4I, a first trench 59 may be formed in the semiconductor stack S and the substrate 51. The first trench 59 may be formed by a series of etch processes in which the semiconductor stack S and the substrate 51 are etched by using the second mask pattern 58 (See, FIG. 4H) as an etch barrier. An active region may be defined by the first trench 59. The first trench 59 may extend in the first direction Y.

Then, a second mask pattern 58 may be removed. When the second mask pattern 58 includes a photoresist, it may be removed by a dry strip process. For example, the dry strip process may include an oxygen strip process.

When the formation of the first trench 59 is completed, the first silicon-containing layer 54 may not be completely removed and remain in a spacer shape on sidewalls of the protruding portion 53. The first silicon-containing layer 54 remaining in a spacer shape on sidewalls of the protruding portion 53 may function as a first fin and a second fin of a gate to be formed in a subsequent process.

Figure 4J:
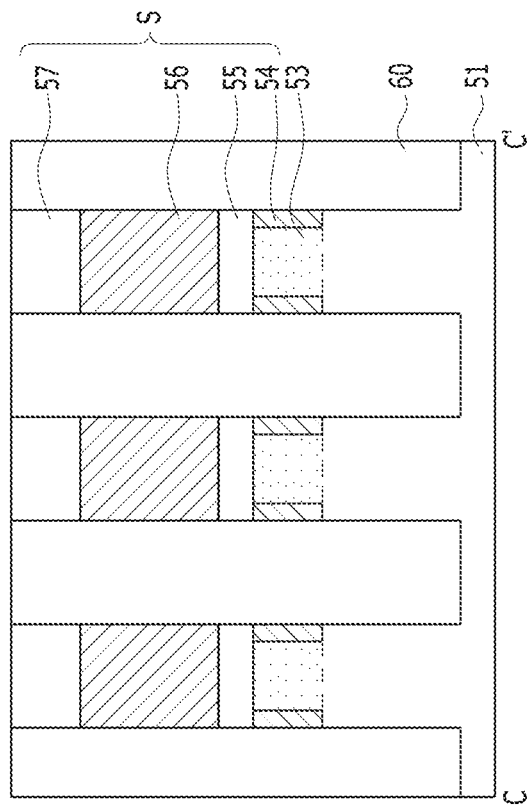
Figure 4J:
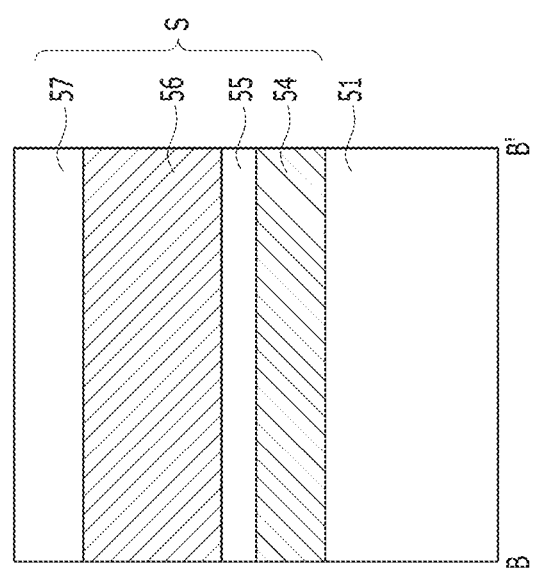

As shown in FIG. 4J, a device isolation region 60 filling first trench 59 may be formed. The device isolation region 60 may be formed by a series of processes for filling the first trench 59 with a dielectric material and isolating the dielectric material filled in each first trench 59 from each other. The device isolation region 60 may include silicon oxide, silicon nitride or a combination thereof.

Figure 4K:
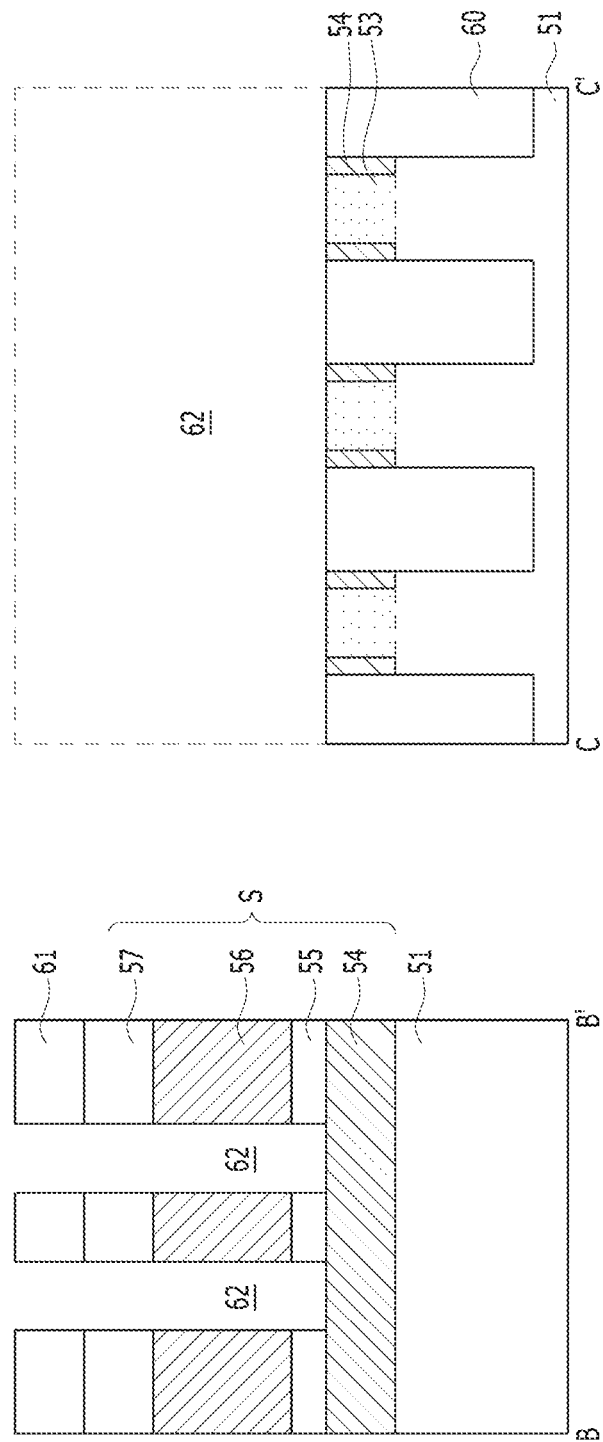

As shown in FIG. 4K, a third mask pattern 61 may be formed over the fourth silicon-containing layer 57 and the device isolation region 60. The third mask pattern 61 may be formed by a photolithography process. The third mask pattern 61 may include a photoresist. The third mask pattern 61 may extend in the second direction X.

Then, a second trench 62 may be formed by etching the fourth silicon-containing layer 57 to the second silicon-containing layer 55 by using the third mask pattern 61 as an etch barrier. The second trench 62 may be a region in which a buried gate is formed through a subsequent process. The etch process for forming the second trench 62 may be performed by separately performing etch processes for the fourth silicon-containing layer 57, the third silicon-containing layer 56 and the second silicon-containing layer 55, respectively. In particular, the etch process may be performed by adjusting etch selectivity so that the first silicon-containing layer 54 may function as an etch stop layer.

Figure 4L:
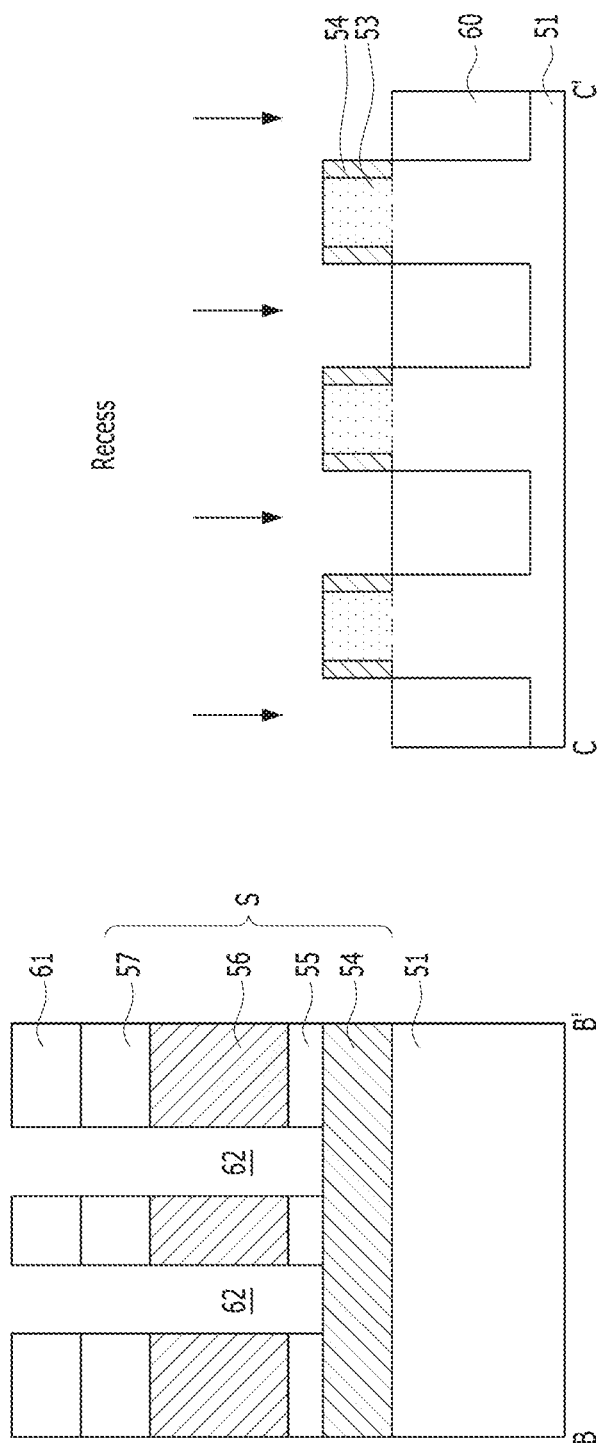

As shown in FIG. 4L, the device isolation region 60 may be recessed at a predetermined depth. As the device isolation region 60 is recessed, the protruding portion 53 and the first silicon-containing layer 54 protrude over the device isolation region 60 and thus, a first fin and second fin structure may be formed.

Figure 4M:
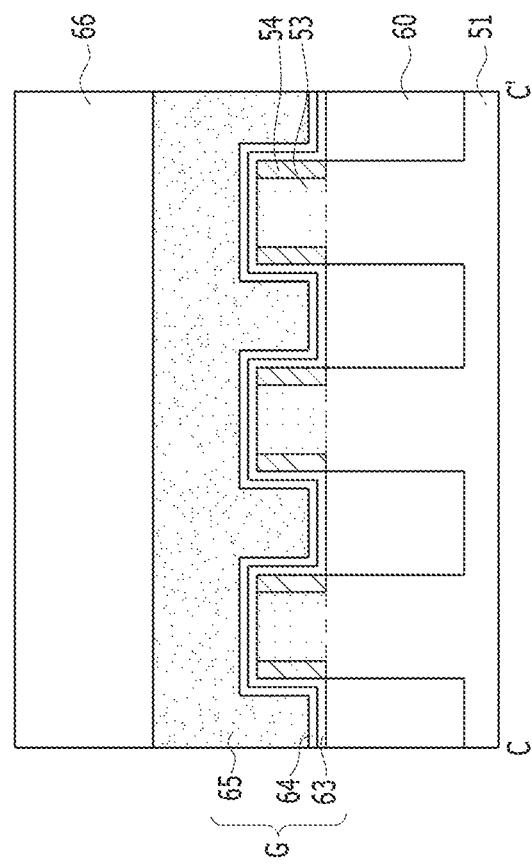
Figure 4M:
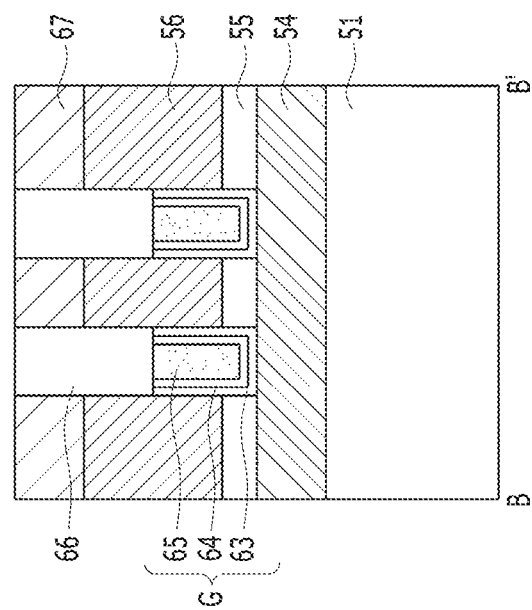

As shown in FIG. 4m, a third mask pattern 61 (See, FIG. 4L) may be removed. When the third mask pattern 61 includes a photoresist, it may be removed by a dry strip process. For example, the dry strip process may include an oxygen strip process.

Then, a gate G filling the second trench 62 and a gate protection layer 66 may be formed. The gate G may be a buried gate filling a portion of the second trench 62. The gate G may include a gate dielectric layer 63, a diffusion barrier layer 64 and a metal-containing layer 65.

In order to form the gate G, first, the gate dielectric layer 63 and the diffusion barrier layer 64 in a liner shape may be formed along a front surface of the second trench 62. Then, the metal-containing layer 65 filling the second trench 62 may be formed over the diffusion barrier layer 64. Then, an isolation process may be performed to isolate the metal-containing layer 65, the diffusion barrier layer 64 and the gate dielectric layer 63 from the neighboring second trench 62. Finally, the metal-containing layer 65, the diffusion barrier layer 64 and the gate dielectric layer 63 may be recessed at a predetermined depth so as to fill only a portion of the second trench 62.

The gate dielectric layer 63 may include silicon oxide, silicon nitride, silicon oxynitride, a high-K material or a combination thereof. The high-K material may include a material having a dielectric constant larger than that of silicon. For example, the high-K material may include a material having a dielectric constant more than about 3.9. In another implementation, the high-K material may include a material having a dielectric constant more than about 10. In still another implementation, the high-K material may include a material having a dielectric constant of about 10 to about 30. The high-K material may include at least one metallic element. The high-K material may include a hafnium-containing material. The hafnium-containing material may include hafnium oxide, hafnium silicon oxide, hafnium silicon oxynitride or a combination thereof. In another implementation, the high-K material may include lanthanum oxide, lanthanum aluminum oxide, zirconium oxide, zirconium silicon oxide, zirconium silicon oxynitride, aluminum oxide, and a combination thereof. Any other known high-K materials may be employed as the high-K material. In this implementation, the gate dielectric layer 63 may be formed by oxidizing a surface of the second trench 62. In another implementation, the gate dielectric layer 63 may include silicon oxide formed by oxidizing liner polylsilicon. In still another implementation, the gate dielectric layer 63 may include silicon oxide formed by oxidizing liner nitride.

The metal-containing layer 65 may be silicon-based material, metal-based material or a combination thereof. The metal-containing layer 65 may include titanium nitride, tungsten or a combination thereof. The metal-containing layer 65 may be a metallic material having a work function. The metal-containing layer 65 may have an N-type work function or a P-type work function. When an NMOSFET is formed, the metal-containing layer 65 may have an N-type work function. When a PMOSFET is formed, the metal-containing layer 65 may have a P-type work function. For work function engineering, various materials having work functions may be used.

The gate protection layer 66 may be formed over the gate G. The gate protection layer 66 may be formed by a series of processes for filling a remaining portion of the second trench 62 over the gate G and then isolating the gate protection layer 66 from the neighboring second trench 62. The gate protection layer 66 may serve to protect the gate G. The gate protection layer 66 may include a dielectric material. The gate protection layer 66 may include silicon nitride, silicon oxynitride or a combination thereof. In another implementation, the gate protection layer 66 may include a combination of silicon nitride and silicon oxide. For example, the gate protection layer 66 may be formed by lining with silicon nitride and then filling with a spin on dielectric (SOD) material. In another implementation, the gate protection layer 66 may have an ONO (oxide-nitride-oxide) structure.

Then, the fourth silicon-containing layer 57 (See, FIG. 4L) may be removed. The fourth silicon-containing layer 57 may be formed of a material having etch selectivity with respect to the third silicon-containing layer 56 and capable of being easily removed so that it may be easily removed by a etch process or a wash process. A plug region may be formed over the third silicon-containing layer 56 functioning as a junction by removing the fourth silicon-containing layer 57.

Then, a plug 67 may be formed in a region in which the fourth silicon-containing layer 57 is removed. The plug 67 may include a conductive material. The plug 67 may serve to reduce an interfacial resistance with an upper layer to be formed by a subsequent process. The plug 67 may include, for example, polysilicon or a metal-containing layer.

Figure 5:
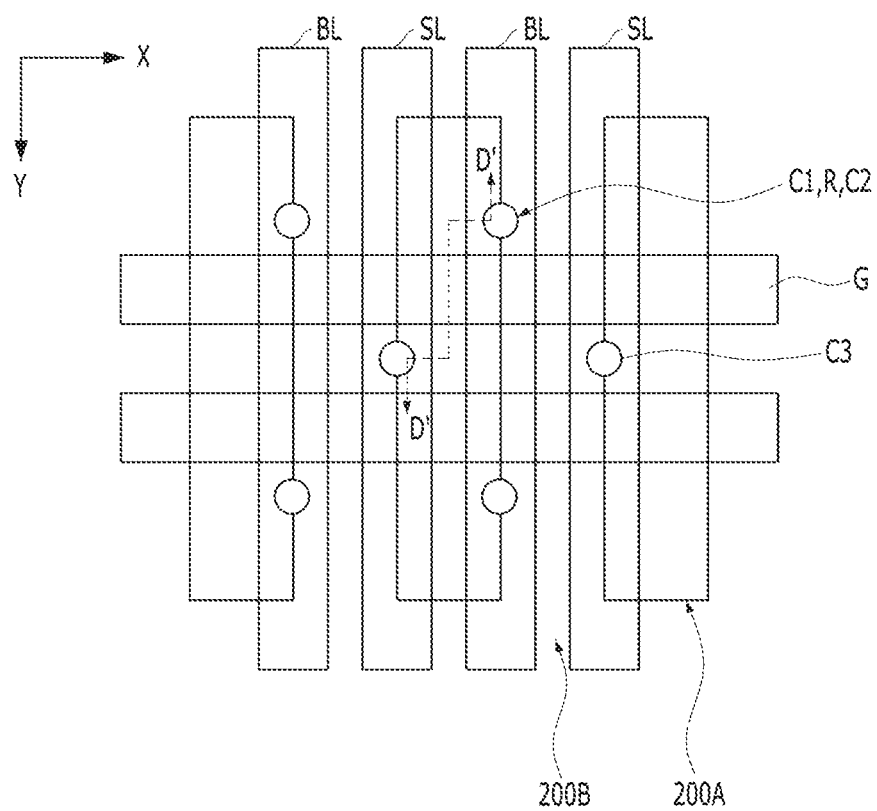
FIG. 5 is a plan view illustrating a semiconductor memory including a fin transistor in accordance with an implementation of the present disclosure.
Figure 6:
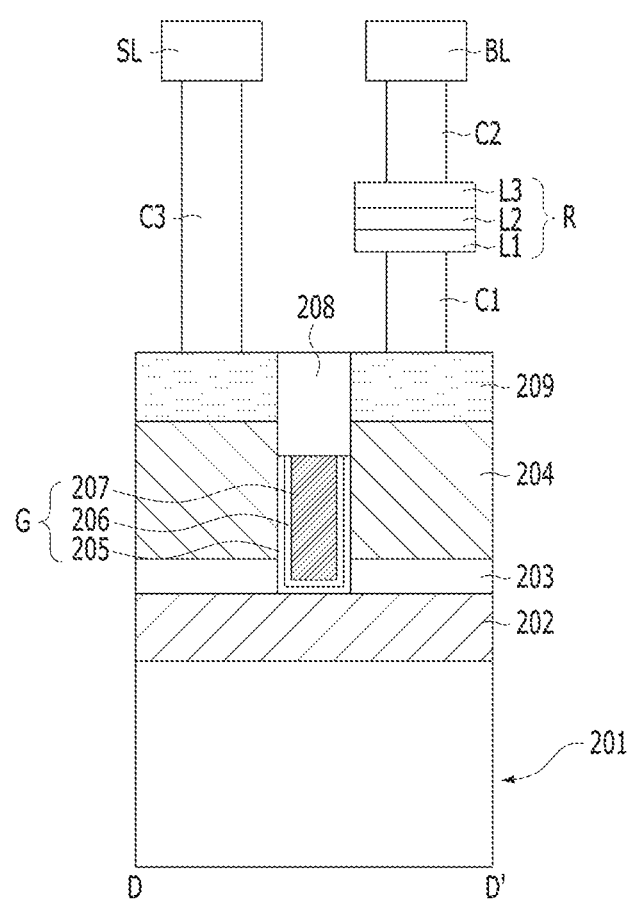
FIG. 6 is a cross-sectional view taken along the line D-D' of FIG. 5.

FIG. 5 is a plan view illustrating a semiconductor memory including a fin transistor in accordance with an implementation of the present disclosure and FIG. 6 is a cross-sectional view taken along the line D-D' of FIG. 5.

As shown in FIGS. 5 and 6, a semiconductor memory in accordance with an implementation of the present disclosure may include a transistor fabricated by the implementation shown in FIGS. 3A to 3L or FIGS. 4A to 4M. In this implementation, the reference number 201 may refer to a substrate, the reference number 202 may refer to a first silicon-containing layer, the reference number 203 may refer to a second silicon-containing layer, and the reference number 204 may refer to a third silicon-containing layer. Moreover, the reference number 205 may refer to a gate dielectric layer, the reference number 206 may refer to a diffusion barrier layer, and the reference number 207 may refer to a metal-containing layer. Further, the reference number 208 may refer to a gate protection layer, and the reference number 209 may refer to a plug.

In addition, a variable resistance element R of which a lower end is coupled with one side of the transistor, a bit line BL coupled with an upper end of the variable resistance element R, and a source line SL positioned between adjacent two gates G on the other side of the transistor, for example, in a first direction Y may be included.

The variable resistance element R may contact with a plug 209 through a first contact C1 passing through an interlayer dielectric layer (not shown), and the bit line BL may be coupled with the variable resistance element R through a second contact C2 passing through the interlayer dielectric layer (not shown). The source line SL may contact with the plug 209 through a third contact C3 passing through the interlayer dielectric layer (not shown).

Here, in a second direction X, the first contact C1, the variable resistance element R, the second contact C2 and the bit line BL may be formed so as to lean on one side, for example, the right side of an active region 200A, on the contrary, the third contact C3 and the source line SL may be formed so as to lean on the other side, for example, the left side of the active region 200A. This is to secure a space between a stack structure of the first contact C1, the variable resistance element R, the second contact C2 and the bit line BL and a stack structure of the third contact C3 and the source line SL and thus prevent an electrical short therebetween.

Meanwhile, the variable resistance element R is an element capable of switching between different resistance states according to a voltage or current applied through the transistor coupled with the lower end of the variable resistance element R and the bit line BL coupled with the upper end of the variable resistance element R. The variable resistance element R may have a single-layered or multi-layered structure including various material used in an RRAM (resistive random access memory), a PRAM (phase change random access memory), an FRAM (ferroelectric random access memory), an MRAM (magnetic random access memory), etc. for example, transition metal oxide, metal oxide such as a perovskite material, a phase change material, a ferroelectric material, a ferromagnetic material, etc. such as a chalcogenide material, etc. The variable resistance element R may store different data according to the resistance state.

In this implementation, the variable resistance element R may include an MTJ (Magnetic Tunnel Junction) element including a first magnetic layer L1, a tunnel barrier layer L2 and a second magnetic layer L3. In this case, any one of the first and second magnetic layers L1 and L3 may function as a pinned layer having a pinned magnetization direction, and the other may function as a free layer having a variable magnetization direction. And, the first and second magnetic layers L1 and L3 may have a single-layered structure or a multi-layered structure including a ferromagnetic material such an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. The tunnel barrier layer L2 may serve to change the magnetization direction of the free layer by tunneling of electrons and, for example, have a single-layered structure or a multi-layered structure including oxide such as MgO, CaO, SrO, TiO, VO, NbO, etc. When the magnetization direction of the free layer is parallel to that of the pinned layer, the variable resistance element R may be a low resistance state, and when the magnetization direction of the free layer is anti-parallel to that of the pinned layer, the variable resistance element R may be a high resistance state.

However, the present disclosure is not limited thereto, and in addition to the variable resistance element R, various memory devices capable of storing data, for example, a capacitor and the like may be coupled with one end of the transistor.

In accordance with the implementation as described above, it is possible to secure a fin transistor having a superior characteristic, a method for fabricating the fin transistor, and an electronic device including the same.

The above and other memory circuits or semiconductor devices based on the disclosed technology can be used in a range of devices or systems. FIGS. 7-11 provide some examples of devices or systems that can implement the memory circuits disclosed herein.

Figure 7:
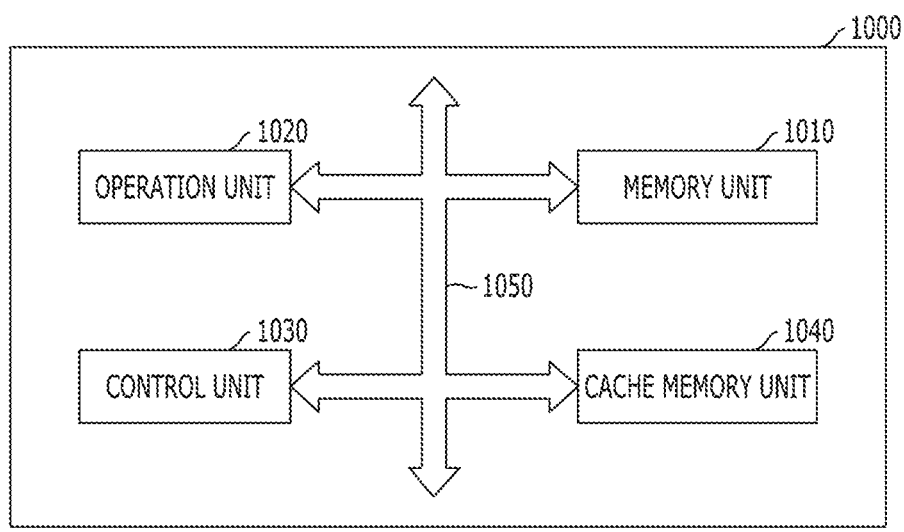
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the memory unit 1010 may be improved and fabricating processes may be easy. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
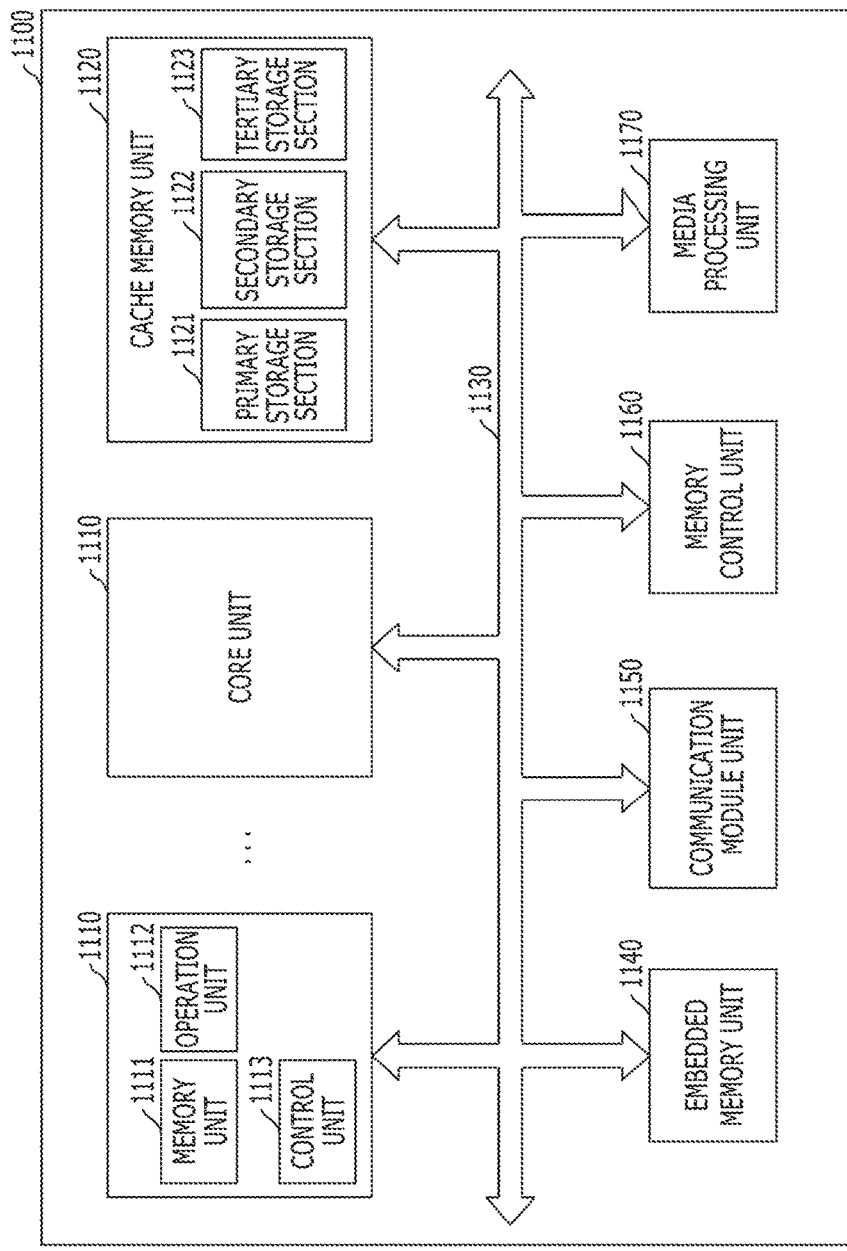
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the cache memory unit 1120 may be improved and fabricating processes may be easy. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
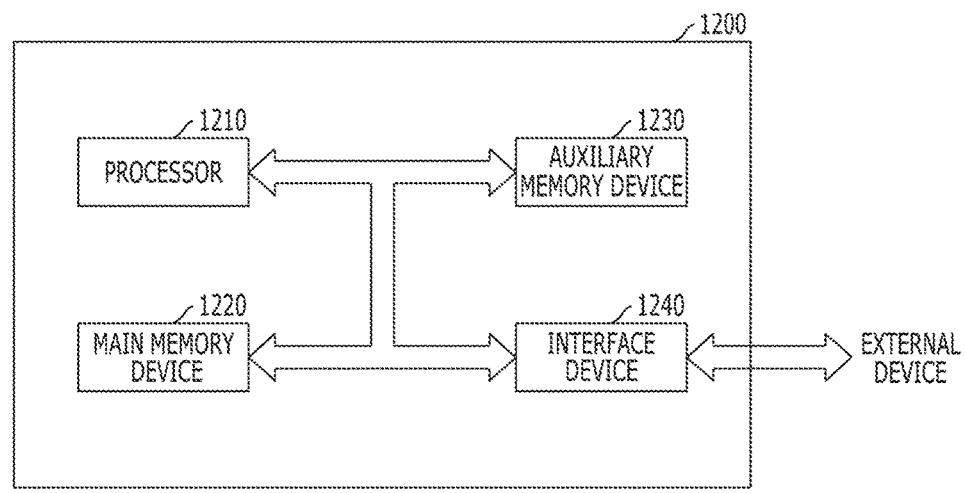
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the main memory device 1220 may be improved and fabricating processes may be easy. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the auxiliary memory device 1230 may be improved and fabricating processes may be easy. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
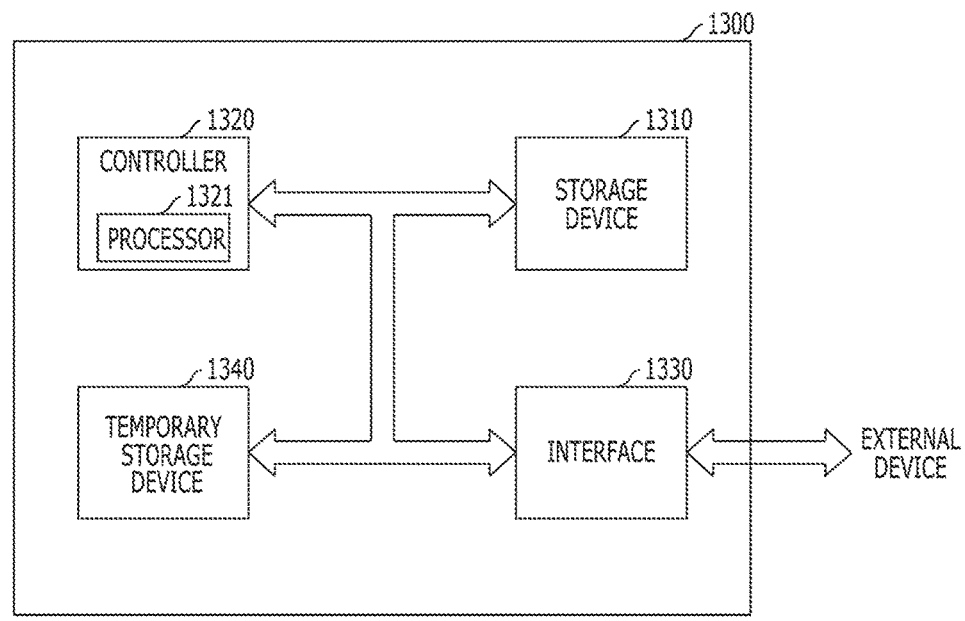
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the storage device 1310 or the temporary storage device 1340 may be improved and fabricating processes may be easy. As a consequence, operating characteristics and data storage characteristics of the data storage system 1300 may be improved.

Figure 11:
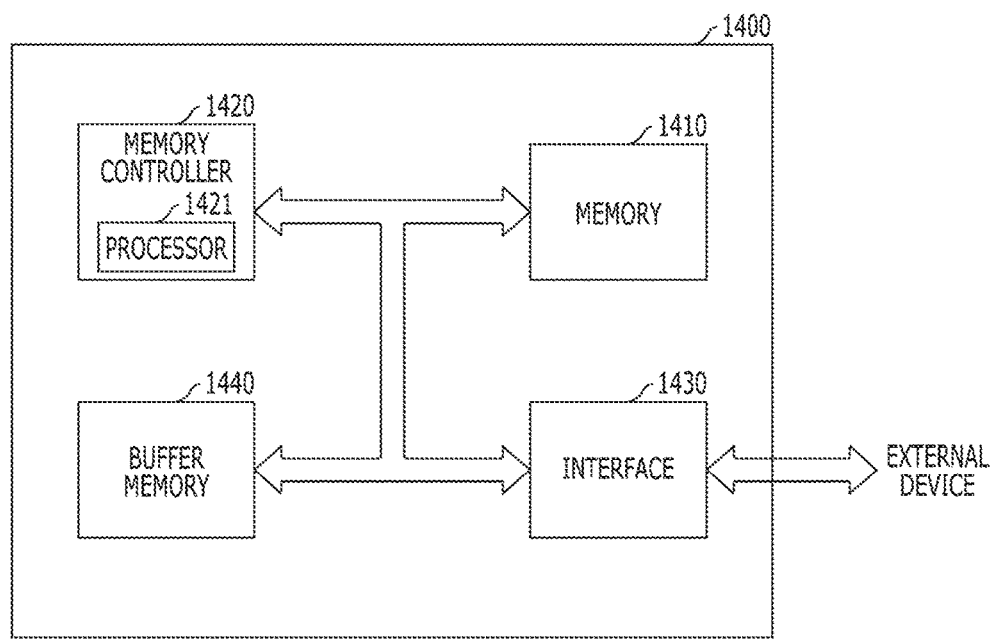
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the memory 1410 may be improved and fabricating processes may be easy. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate having a device isolation region and an active region; a layer formed over the substrate and having a trench crossing the device isolation region and the active region; a gate filled in the trench; a first fin formed over and overlapping the active region and protruding over the device isolation region; second fins formed on both sidewalls of the first fin in a direction of the trench; and a memory device coupled with the substrate on one side of the gate. Through this, data storage characteristics of the buffer memory 1440 may be improved and fabricating processes may be easy. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device, comprising:
a fin transistor formed over a substrate which is structured to include a device isolation region and an active region extending in a first direction, the fin transistor including
a layer formed over the substrate and having a trench extending in a second direction crossing the first direction;
a gate filled in the trench; and
a fin portion formed over and overlapping the active region and protruding over the device isolation region, wherein the fin portion includes a first fin extending in the first direction and having a width smaller than a width of the active region in the second direction and second fins formed on both sidewalls of the first fin and having outer sidewalls aligned with sidewalls of the active region, and
wherein top surfaces of the second fins are located at a same height as a bottom surface of the trench in a region in which the trench and the active region overlap with each other, and
wherein the second fins include a silicon germanium layer.

2. The electronic device of claim 1, wherein one or more active regions and one or more device isolation regions extend in the first direction, respectively, and are alternately arranged in the second direction.

3. The electronic device of claim 1, wherein one or more gates extend in the second direction and are separately disposed at a predetermined distance in the first direction.

4. The electronic device of claim 1, wherein the gate includes a gate dielectric layer formed along the first fin and second fins, a diffusion barrier layer, and a metal-containing layer formed over the diffusion barrier layer and filling a portion of the trench.

5. The electronic device of claim 1, further comprising a gate protection layer over the gate.

6. The electronic device of claim 1, wherein the layer includes a semiconductor stack a plurality of silicon-containing layers, and any one silicon-containing layer among the plurality of silicon-containing layers includes a junction layer.

7. The electronic device of claim 6, wherein the junction layer includes a silicon germanium layer or a silicon carbide layer.

8. The electronic device of claim 6, wherein the junction layer includes a silicon-containing layer in which an N-type dopant or a P-type dopant is doped.

9. The electronic device of claim 6, wherein the junction layer includes a silicon-containing layer in which phosphorous (P) is doped.

10. The electronic device of claim 1, further comprising:
a memory device coupled with the substrate on one side of the gate.

11. The electronic device of claim 10, wherein the memory device includes a variable resistance element switching between different resistant states according to an applied voltage or current.

12. The electronic device of claim 11, wherein the variable resistance element includes a first magnetic layer, a second magnetic layer and a tunnel barrier layer interposed between the first magnetic layer and the second magnetic layer.

13. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the fin transistor is part of the memory unit in the microprocessor.

14. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the fin transistor is part of the cache memory unit in the processor.

15. The electronic device of claim 1, further comprising a processing system which includes:
a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the fin transistor is part of the auxiliary memory device or the main memory device in the processing system.

16. The electronic device of claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the fin transistor is part of the storage device or the temporary storage device in the data storage system.

17. The electronic device of claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the fin transistor is part of the memory or the buffer memory in the memory system.

* * * * *